United States Patent

Shinohe et al.

[11] Patent Number: 5,910,738
[45] Date of Patent: Jun. 8, 1999

[54] DRIVING CIRCUIT FOR DRIVING A SEMICONDUCTOR DEVICE AT HIGH SPEED AND METHOD OF OPERATING THE SAME

[75] Inventors: Takashi Shinohe, Yokohama; Masakazu Yamaguchi; Kimihiro Hoshi, both of Tokyo, all of Japan

[73] Assignee: Kabushiki Kaisha Toshiba, Kawasaki, Japan

[21] Appl. No.: 08/628,515

[22] Filed: Apr. 5, 1996

[30] Foreign Application Priority Data

Apr. 7, 1995 [JP] Japan .................................. 7-082120
Apr. 11, 1995 [JP] Japan .................................. 7-085505

[51] Int. Cl.[6] .................................................. H03K 3/00
[52] U.S. Cl. ......................... 327/108; 327/434; 327/514; 250/214 LS
[58] Field of Search .................. 327/108–112, 374–377, 327/427, 434, 437, 436, 514, 515; 250/214 LS

[56] References Cited

U.S. PATENT DOCUMENTS

| | | |
|---|---|---|
| 4,390,790 | 6/1983 | Rodriguez . |
| 4,937,476 | 6/1990 | Bazes ........................................ 326/71 |
| 5,079,455 | 1/1992 | McCafferty et al. .................... 327/318 |
| 5,311,115 | 5/1994 | Archer ..................................... 323/315 |
| 5,426,334 | 6/1995 | Skovmand ............................... 327/427 |
| 5,444,363 | 8/1995 | Cabler ...................................... 323/315 |
| 5,515,027 | 5/1996 | Billig et al. .............................. 340/438 |
| 5,523,669 | 6/1996 | Oku et al. ................................. 320/14 |
| 5,530,385 | 6/1996 | Miettinen ................................ 327/108 |
| 5,534,814 | 7/1996 | Archer ..................................... 327/108 |
| 5,541,436 | 7/1996 | Kwong et al. ........................... 257/410 |
| 5,589,790 | 12/1996 | Allen ....................................... 327/320 |
| 5,629,571 | 5/1997 | Roudeski ................................. 307/130 |

FOREIGN PATENT DOCUMENTS 63-99616 4/1988 Japan .
1-179518 7/1989 Japan .

Primary Examiner—Kenneth B. Wells
Attorney, Agent, or Firm—Oblon, Spivak, McClelland, Maier & Neustadt, P.C.

[57] ABSTRACT

A semiconductor device includes a voltage-driven switching element having a cathode and an anode, in which a voltage is to be applied between the cathode and anode, a power-supply circuit connected between the cathode and anode of the voltage-driven switching element and comprising capacitors, resistors and a reverse current-low preventing diode, for generating an intermediate voltage, a charging switching element for charging a gate of the voltage-driven switching element, using the intermediate voltage generated by the power-supply circuit, a discharging switching element for discharging the gate of the voltage-driven switching element, and a photovoltaic element for generating a photovoltaic power to control to drive the charging switching element and the discharging switching element.

15 Claims, 15 Drawing Sheets

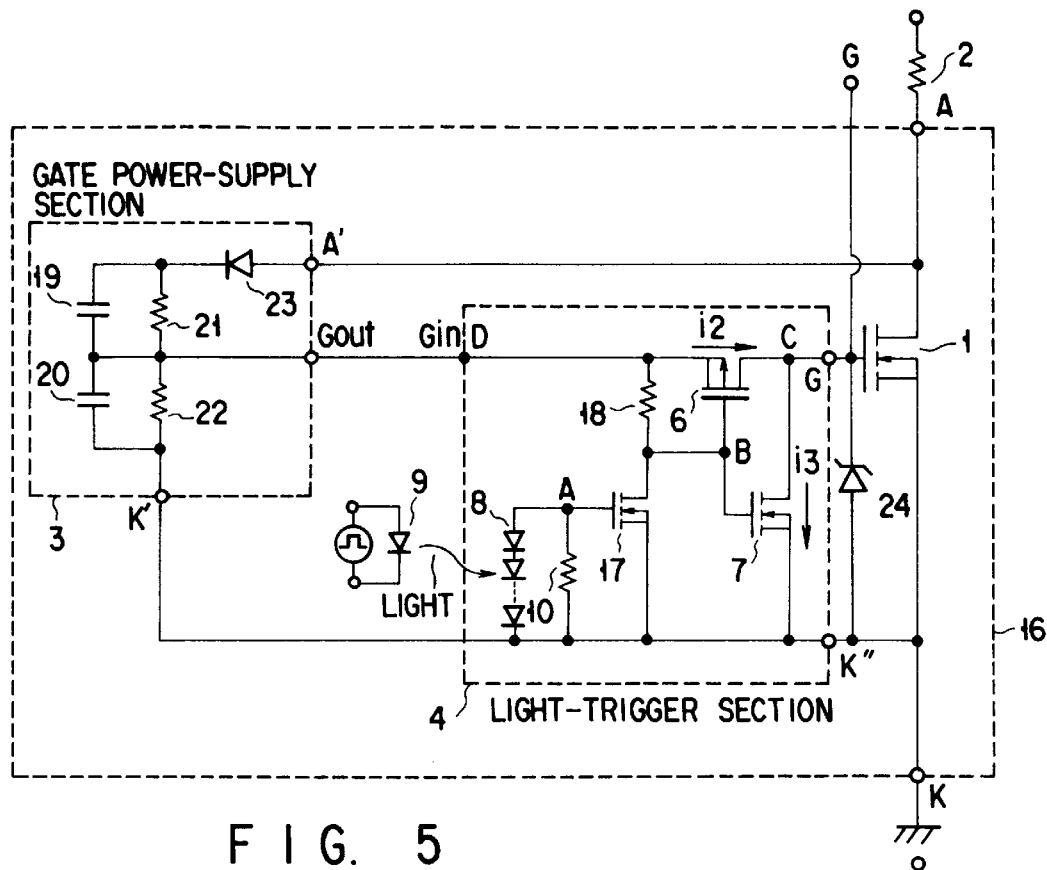
F I G. 5
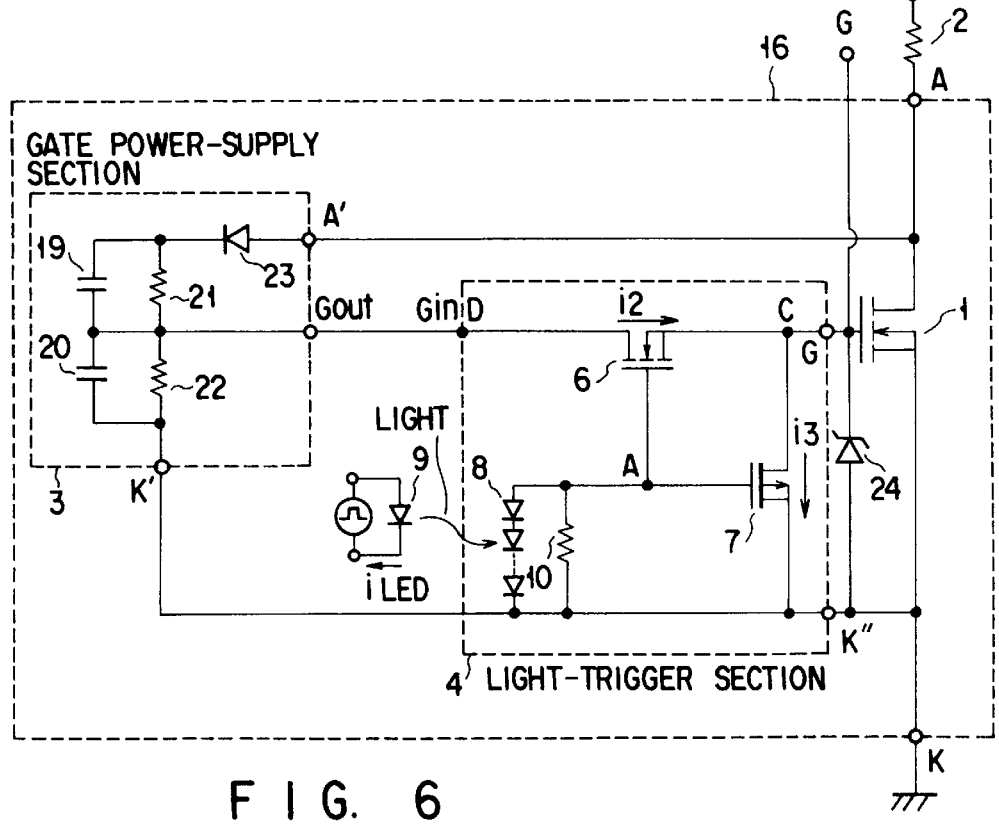
F I G. 6

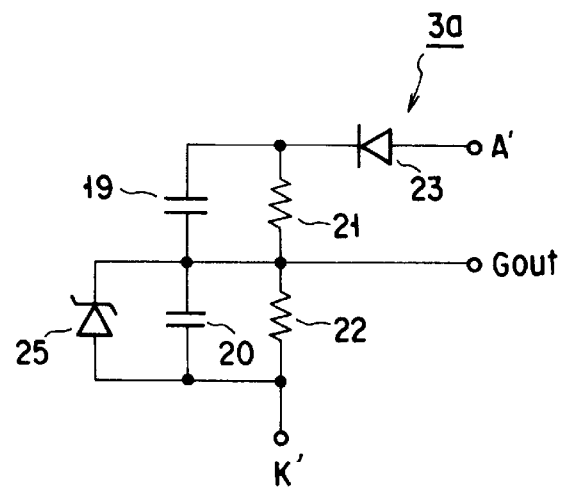
F I G. 9
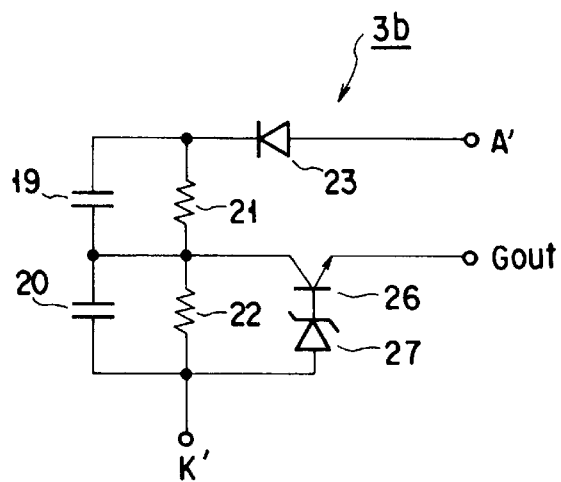
F I G. 10
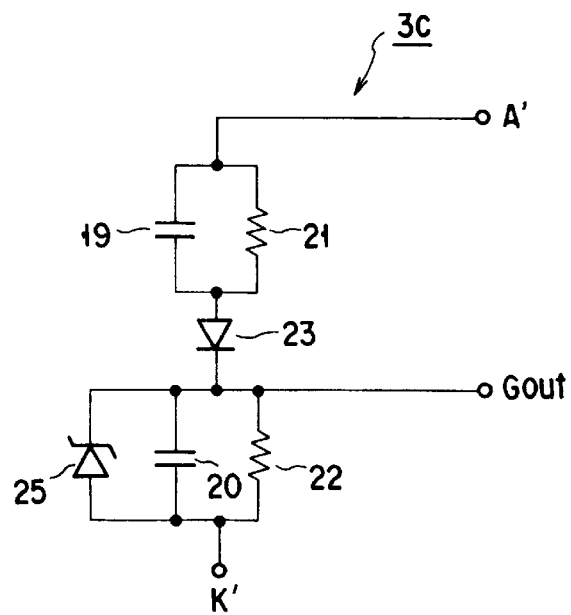
F I G. 11

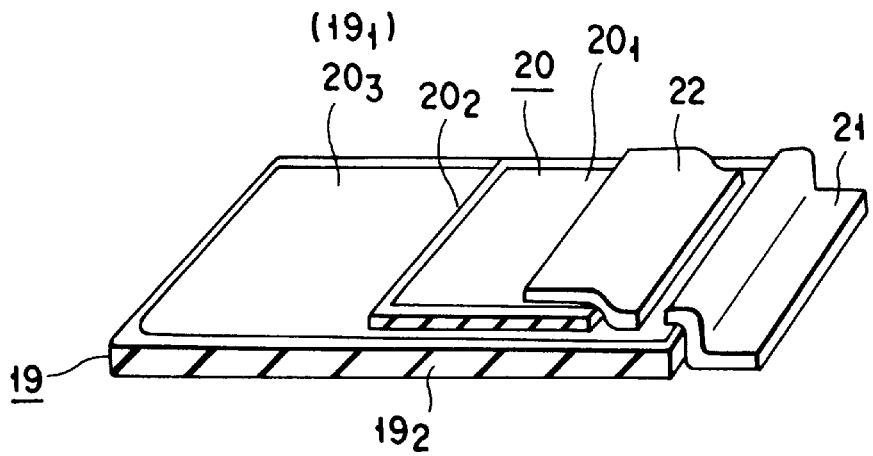
F I G. 16
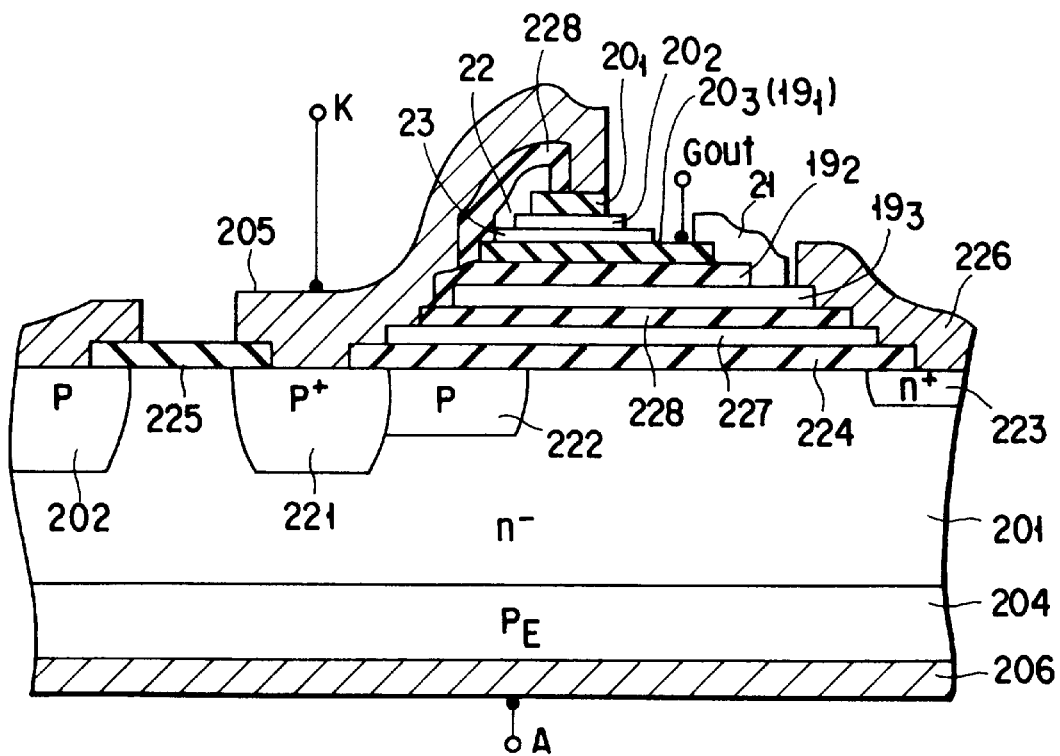
F I G. 17

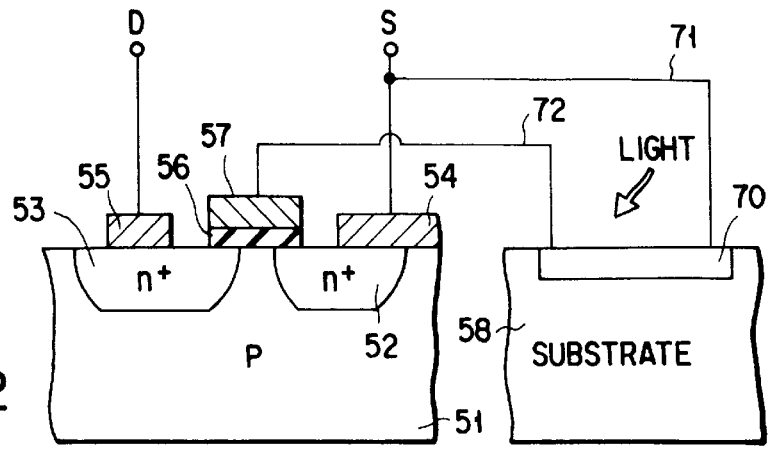
FIG. 22
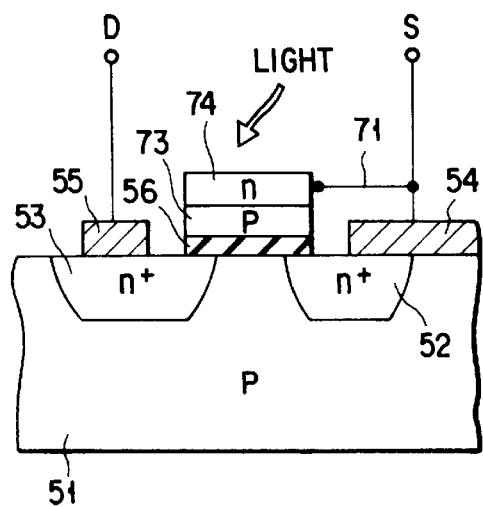
FIG. 23
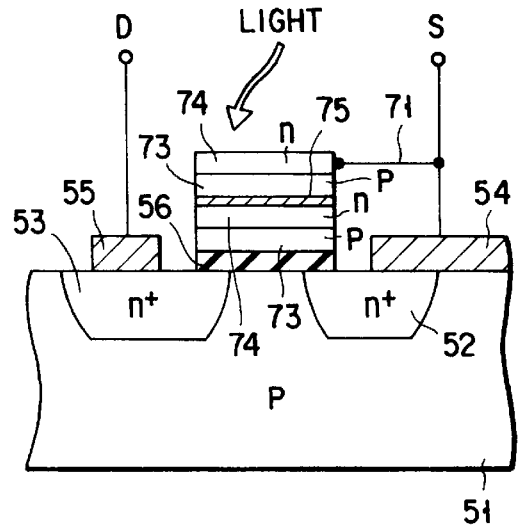
FIG. 24
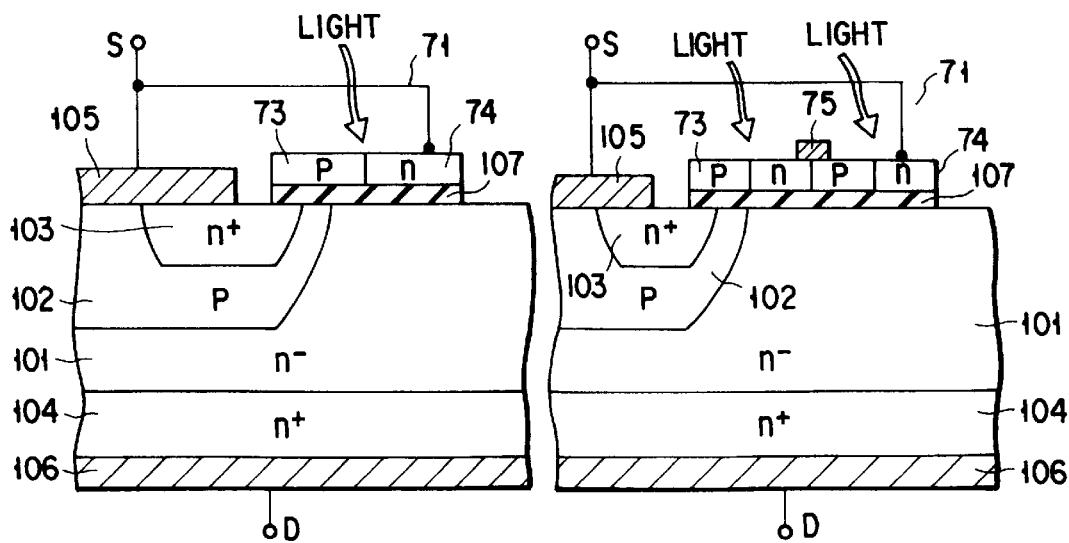
FIG. 25
FIG. 26

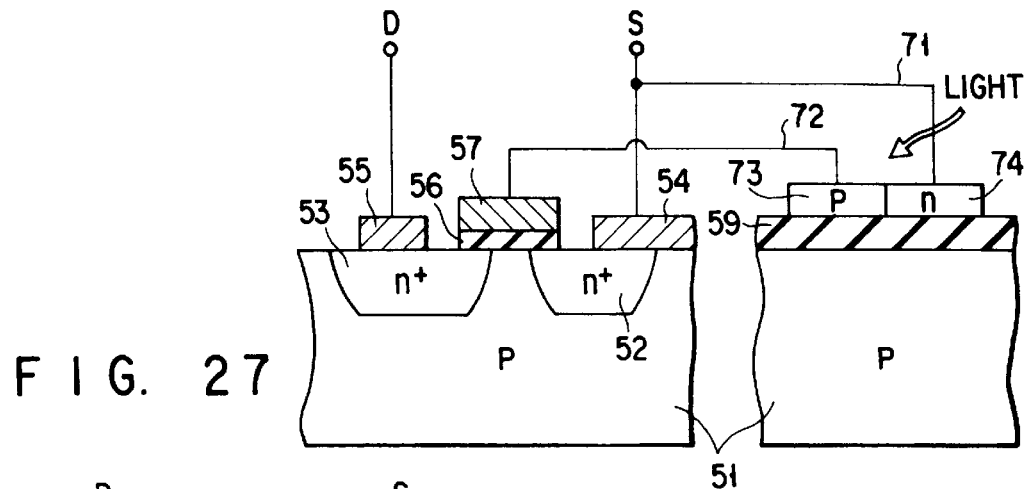
FIG. 27
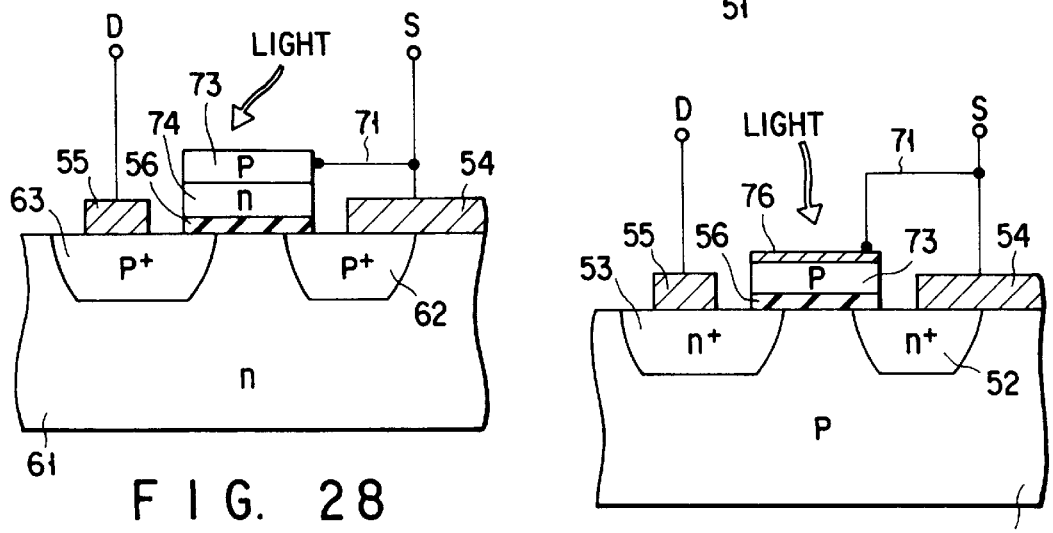
FIG. 28
FIG. 29
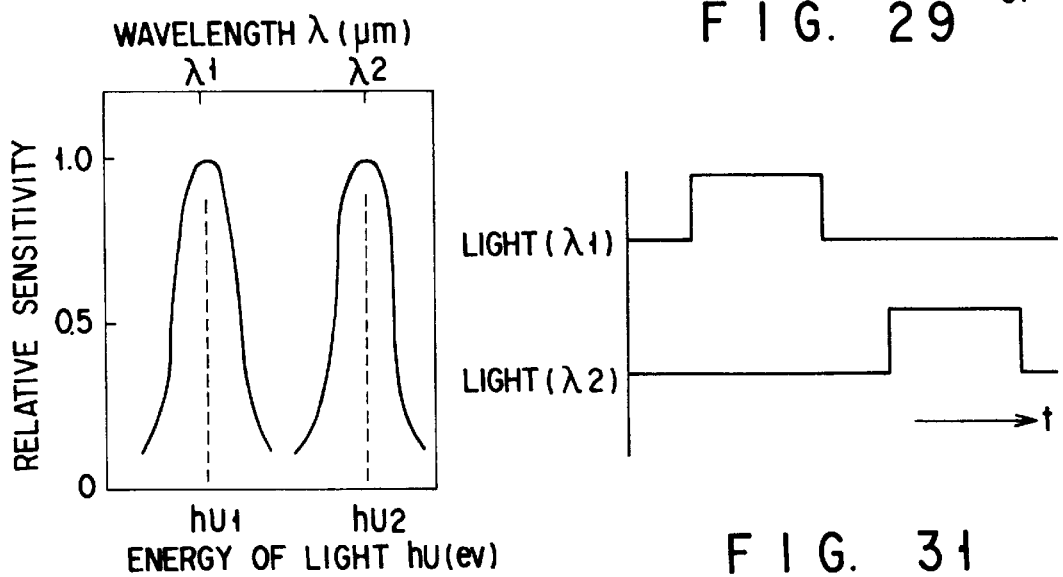
FIG. 30
FIG. 31

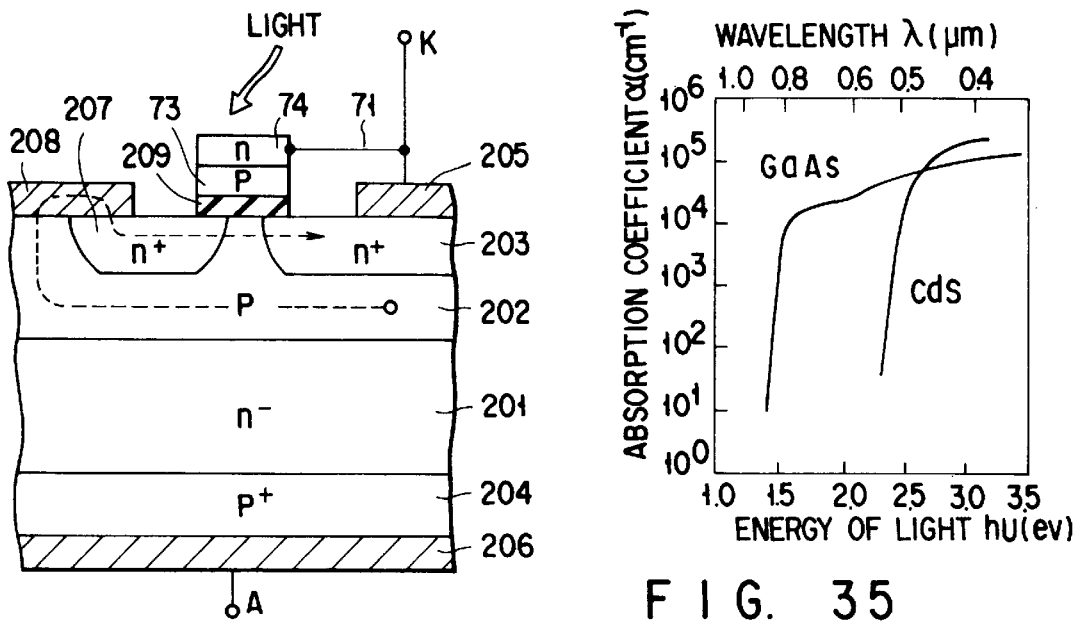
F I G. 32
F I G. 35
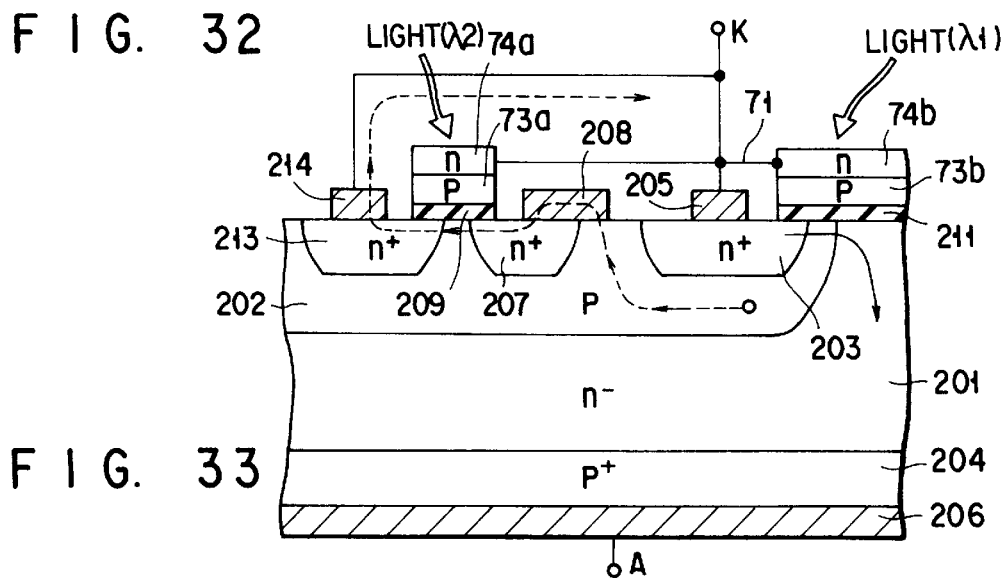
F I G. 33
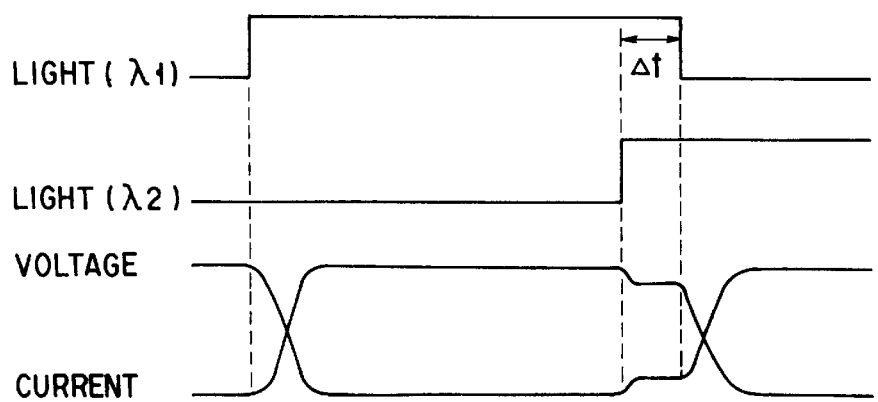
F I G. 34

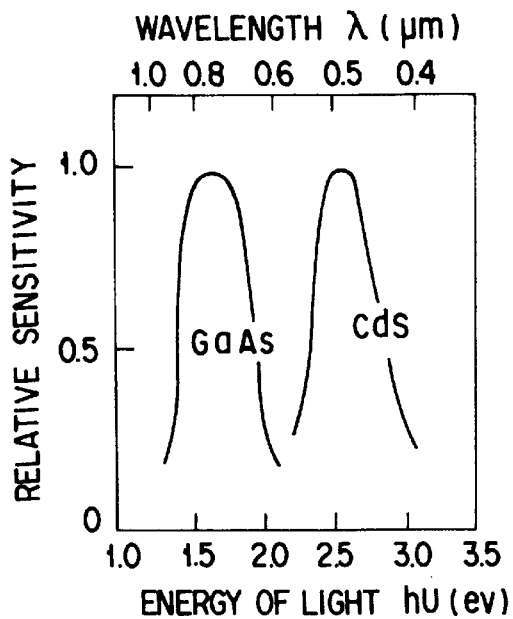
F I G. 36
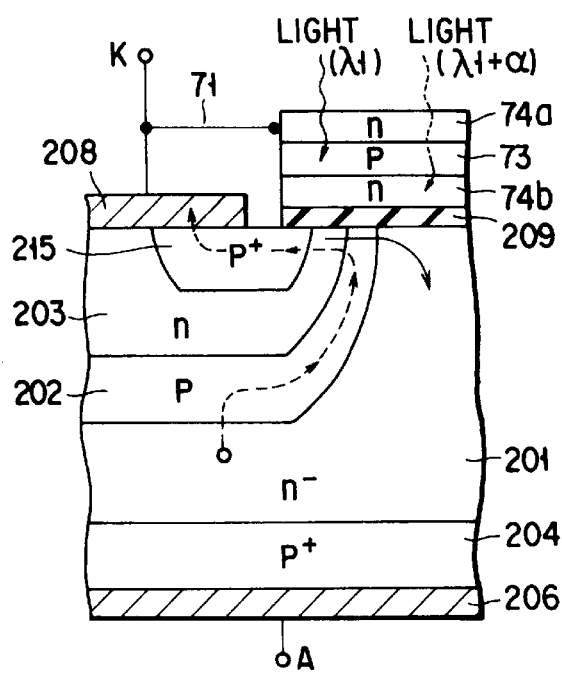
F I G. 37
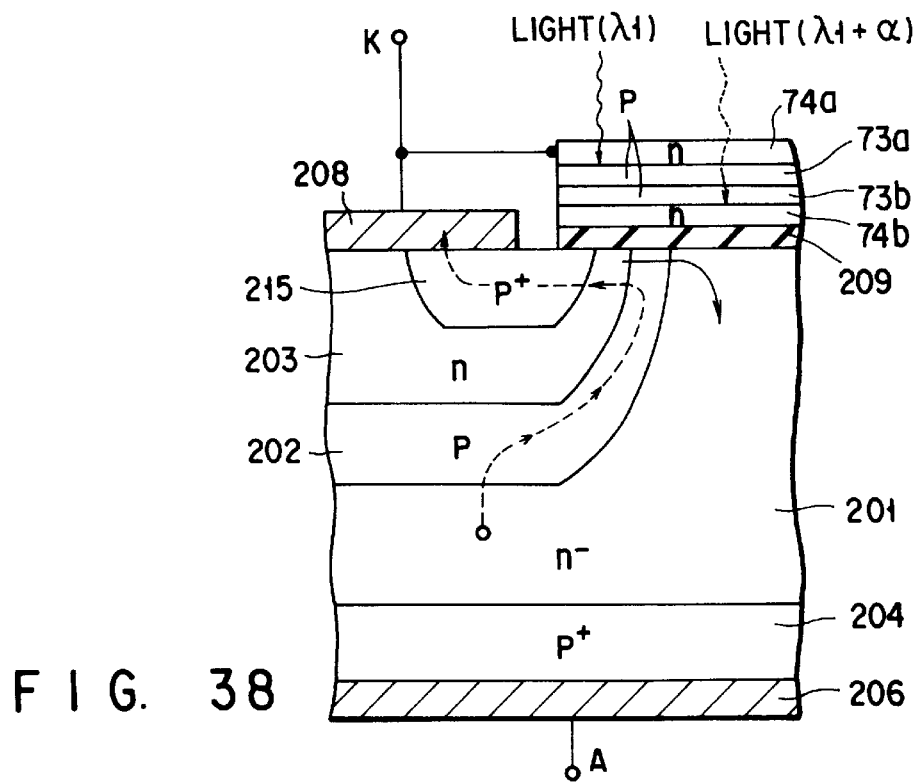
F I G. 38

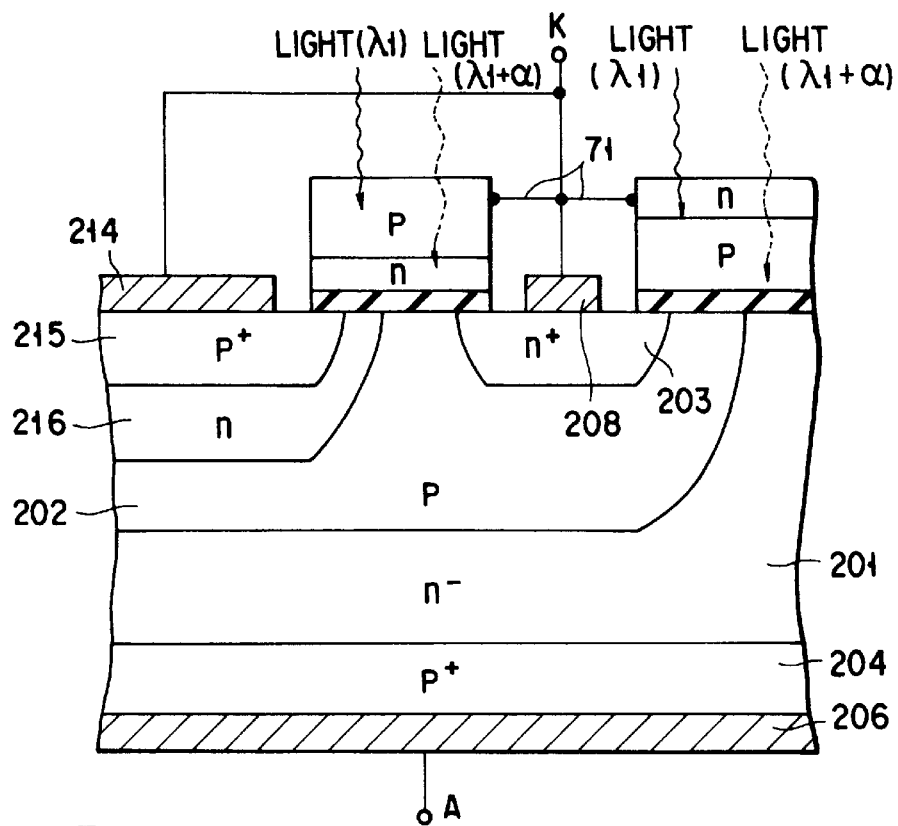
F I G. 39
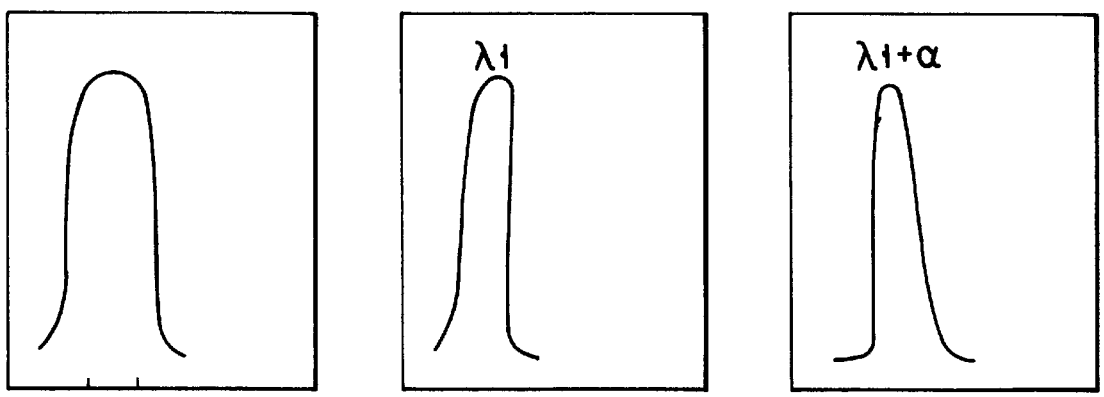
F I G. 40A   F I G. 40B   F I G. 40C

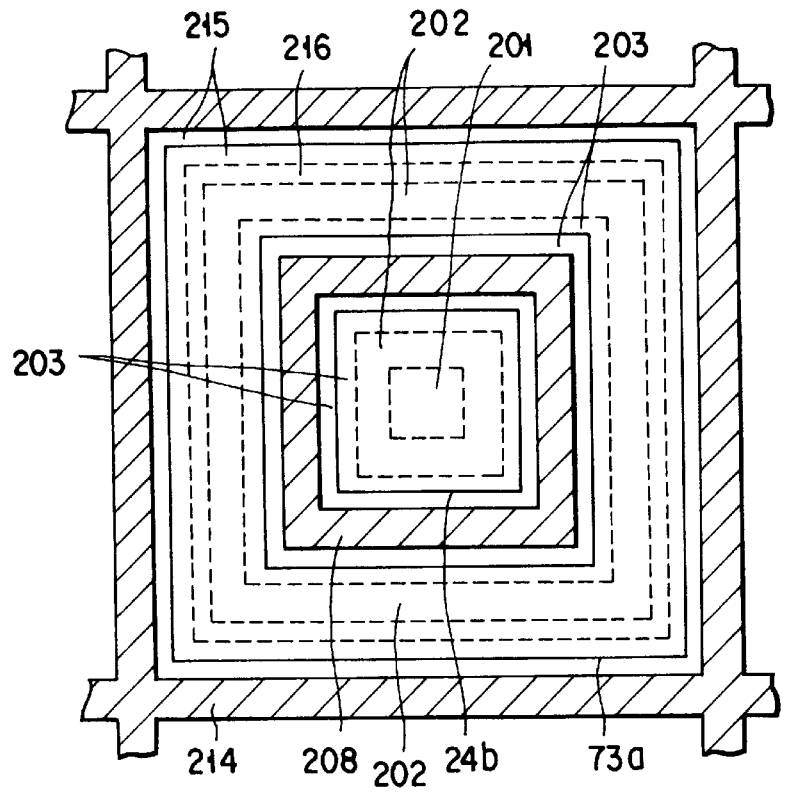
F I G. 41
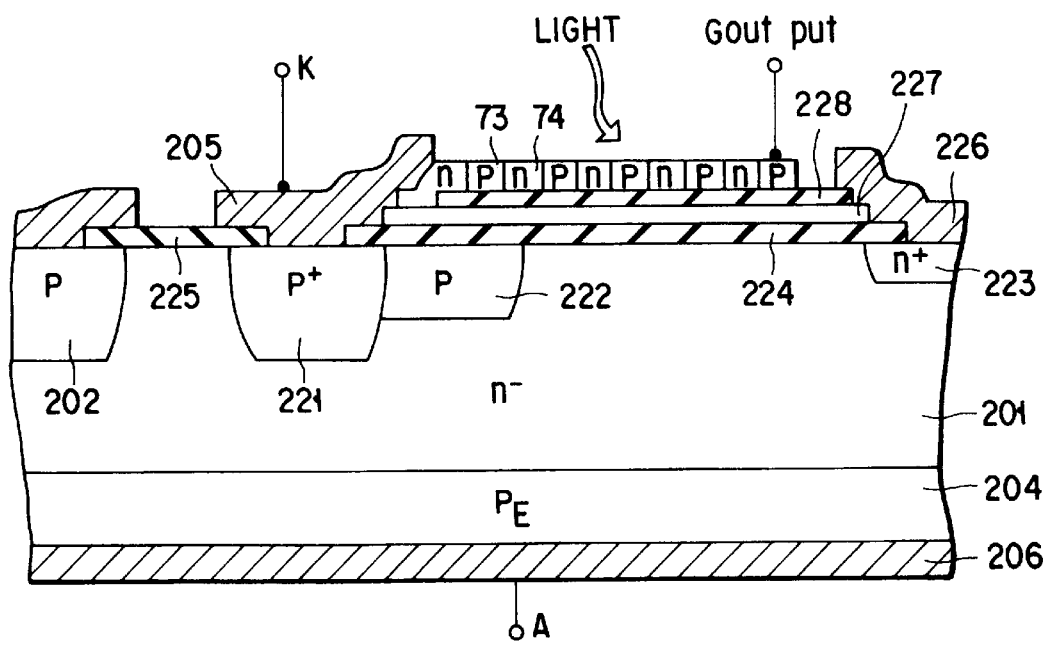
F I G. 42

DRIVING CIRCUIT FOR DRIVING A SEMICONDUCTOR DEVICE AT HIGH SPEED AND METHOD OF OPERATING THE SAME

BACKGROUND OF THE INVENTION

1. Field of the Invention

The present invention relates to a semiconductor device and a method of driving the semiconductor device.

2. Description of the Related Art

FIG. 1 is a schematic representation of a conventional light-triggered semiconductor device. As shown in FIG. 1, this device comprises three main components. The first component is an N-channel enhancement power MOSFET (Metal Oxide Semiconductor Field-Effect Transistor) 1. The second component is a light-trigger section 4 for light-triggering the power MOSFET 1. The third component is a gate power-supply section 3 for applying a gate voltage to the power MOSFET 1.

The light-trigger section 4 comprises a photodiode array 8, a discharging resistor 10 and a CMOS (Complementary Metal Oxide Semiconductor) logic unit 5. The photodiode array 8 can be driven by the light emitted from a light-emitting photodiode 9. The resistor 10 is provided to discharge a gate charge. The CMOS logic unit 5 has a P-channel depletion MOSFET 6a and an N-channel enhancement MOSFET 7a.

The gate power-supply section 3 comprises a power supply 11 for an external gate.

When the light-emitting photodiode 9 emits no light, the gate common to the MOSFETs 6a and 7a remains at the ground potential. Therefore, the P-channel depletion MOSFET 6a is conducting, while the N-channel enhancement MOSFET 7a is not conducting. As a result, the gate power-supply section 3 applies a positive bias to the gate of the power MOSFET 1, turning the MOSFET 1 on.

On the other hand, when the light-emitting photodiode 9 emits light, the common gate of the MOSFETs 6a and MOSFET 7a is positively biased by the photovoltaic power generated by the photodiode array 8. The P-channel depletion MOSFET 6a and the N-channel enhancement MOSFET 7a are thereby turned off and on, respectively. As a result, the charge is discharged from the gate of the power MOSFET 1 through the MOSFET 7a, whereby the power MOSFET 1 is turned off.

The light-triggered semiconductor device shown in FIG. 1 has problems. The MOSFETs 6a and 7a are simultaneously turned on when the CMOS logic unit 5 is switched, and a short current inevitably flows through the MOSFETs 6a and 7a. As a consequence, the gate of the power MOSFET 1 cannot be charged and discharged as fast as desired. Namely, the power MOSFET 1 can not be light-triggered quickly. The power MOSFET 1 may be replaced by a number of voltage-driven thyristors connected in series. In this case, however, isolating transformers must be used to isolate the power-supply sections connected to the gates of the voltage-driven thyristors. The semiconductor device will then become too large.

FIG. 2 is a schematic representation of another conventional light-triggered semiconductor device. As seen from FIG. 2, the gate power-supply section 3 incorporated in this device comprises a photodiode array 12 which generate a photovoltaic power. When the power-supply 15 supplies power to the light-emitting diode array 14, the light-emitting diodes of the array 14 emit light. The light is applied to the photodiodes of the array 12. Since the array 12 generates the photovoltaic power, the charging capacitor 13 connected to the array 12 is thereby charged. Thus, the photodiodes of the array 12 can be sufficiently isolated from one another, even if voltage-driven thyristors are used in great numbers and connected in series.

The light-triggered semiconductor device shown in FIG. 2 has problems, too. The photodiode array 12 achieves photoelectric conversion but at a very low efficiency. The current the array 12 supplies to the charging capacitor 13 is inevitably small. Accordingly, it takes too much time to charge the capacitor 13 and the power MOSFET 1 cannot be driven quickly.

Furthermore, according to the light-triggered semiconductors as shown in FIG. 1 and FIG. 2, if a voltage-increasing rate is high and/or a potential of the anode of the power MOSFET 1 located at the upper voltage side fluctuates in the case where a plurality of power MOSFETs 1 are connected in series, the power MOSFET 1 are erroneously fired, resulting in low reliability.

As indicated above, the conventional light-triggered semiconductor device is disadvantageous in three respects. First, it cannot be light-triggered quickly since it is impossible to charge or discharge the insulated gate of the voltage-driven switching element (e.g., a power MOSFET or an IGBT) as fast as is desired. Second, if a number of voltage-driven switching elements are connected in series, the device will become large. Third, the power MOSFET 1 is apt to be erroneously fired, resulting in low reliability.

Various insulated-gate semiconductor devices are known. They are classified into two types, i.e., voltage-driven ones and current-driven ones. The voltage-driven devices are preferred, because their gates can be driven by a smaller current than the gates of the current-driven devices.

FIG. 3 is a sectional view showing the turn-off insulated gate section of a conventional insulated-gate semiconductor device, i.e., an insulated-gate thyristor. As FIG. 3 shows, a p-type base layer 202 is provided on the upper surface of an n-type base layer 201 having a high resistance. An n-type emitter layer 203 is provided in the surface of the base layer 202. A p-type emitter layer 204 having a high impurity concentration is provided on the lower surface of the base layer 201. A cathode electrode 205 is provided on the emitter layer 203, and an anode electrode 206 on the emitter layer 204.

An n-type drain layer 207 is provided in the surface of the p-type base layer 202, spaced from the emitter layer 203 by a predetermined distance. A gate-insulating film 209 is provided on that portion of the base layer 202 which isolates the emitter layer 203 from the drain layer 207. A gate electrode 210 is provided on the gate-insulating film 209 and functions as a turn-off electrode. An N-channel MOSFET is provided, whose source is the emitter layer 203. The drain electrode 208 contacts not only the drain layer 207 but also the base layer 202. The base layer 202 is therefore short-circuited to the drain layer 207.

A turn-off gate electrode (not shown) has been formed simultaneously with the gate electrode 210, along the edge of the base layer 202, as a component of MOS structure.

In operation, the gate electrode 210 is applied with a voltage positive to the cathode electrode 205. An n-type channel is thereby formed right below the gate electrode 210. A part of the hole current flowing from the p-type base layer 202 directly into the n-type emitter layer 203 is made to flow from the drain electrode 208 to the cathode electrode 205, bypassing through the n-type drain layer 207 and the n-type channel. The hole current, thus bypassing, stops the injection of electrons from the n-type emitter layer 203 into the p-type base layer 202. As a result, the insulated-gate thyristor is turned off.

There are two problems with the insulated-gate thyristor (FIG. 3). First, the insulated-gate thyristor cannot be easily isolated from a control circuit (particularly, a circuit for supplying the gate signal to the device). Second, the insulated-gate thyristor is much influenced by electric noise generated when switching is effected, and is likely to make errors. If the thyristor is be used in, for example, a high-voltage power converter, it needs to have an isolating transformer or the like and will inevitably become larger. An example of a conventional device designed to solve the problems of the insulated-gate semiconductor device is a light-triggered thyristor (LTT).

FIG. 4 is a sectional view showing the light-receiving section of the conventional LTT. As seen from FIG. 4, the LTT comprises a main thyristor and a pilot thyristor. The main thyristor comprises a p-type emitter layer 204, an n-type base layer 201, a p-type base layer 202, and an n-type emitter layer 203a. The pilot thyristor is located beside the main thyristor, and comprises an n-type emitter layer 203b. The n-type emitter layer 203b is partly exposed to receive light.

How the LTT operates will be explained. When light is applied to the exposed part of the n-type emitter layer 203b, a photoelectric current is generated in the depletion region near the main junction formed by the n-type base layer 201 and the p-type base layer 202. The photoelectric current flows horizontally through the p-type base layer 202, reaching the cathode electrode 205a provided in the emitter short-circuiting section of the main thyristor. As the current flows to the cathode electrode 205a, a voltage drop takes place due to the transverse resistance of the p-type base layer 202. The emitter junction formed of the p-type base layer 202 and the n-type emitter layer 203a is biased forwards whereby electrons are injected from the n-type emitter layer 203a into the p-type base layer 202. Thus, the LTT is turned on.

In the immediate future there will be a demand for an insulated-gate semiconductor device which can be driven more efficiently. The conventional devices described above cannot be driven as efficiently as is desired. If provided with a plurality of insulated gates, any conventional insulated-gate semiconductor device is still unable to be driven so efficiently. This is because no methods are available which control the insulated gates easily and reliably.

SUMMARY OF THE INVENTION

Accordingly, it is an object of the present invention to provide a semiconductor device capable of being driven at high speed and serving to reduce the size of the device, and also a method of driving the same.

It is an another object of the present invention to provide a semiconductor device in which a switching element reliably operates, and also a method of driving the same.

According to a first aspect of the present invention, there is provided a method of driving a semiconductor device comprising a voltage-driven switching element, a power-supply circuit connected between a cathode and an anode of the voltage-driven switching element and including capacitors, resistors and a reverse current-flow preventing diode, a charging switching element for charging a gate of the voltage-driven switching element, a discharging switching element for discharging the gate of the voltage-driven switching element, and a photovoltaic element for driving the charging switching element and the discharging switching element, the method comprising the steps of applying a voltage between the cathode and anode of the voltage-driven switching element, generating an intermediate voltage from the power-supply circuit, supplying the intermediate voltage to the charging switching element, and controlling to drive the charging and discharging switching elements, using a photovoltaic power of the photovoltaic element.

The controlling step may include the step of alternately turning on the charging switching element and the discharging switching element to prevent the charging and discharging switching elements from being turned on at the same time. Further, the discharging switching element may be a semiconductor switch which is normally on. The method may further comprise the step of providing a circuit which prevents the intermediate voltage from rising above a predetermined value. Also, the method may further comprise the step of generating the intermediate voltage at a point between high- and low-voltage poles on a junction-termination region of the voltage-driven switching element.

According to a second aspect of the present invention, there is provided a method of driving a semiconductor device comprising the steps of applying a voltage between a cathode and an anode of a plurality of voltage-driven switching elements connected in series, generating an intermediate voltage from a first voltage-driven switching element of the plurality of voltage-driven switching elements, and applying a negative bias to a gate of a second voltage-driven switching element of the plurality of voltage-driven switching elements, which is located on an higher voltage side than that of the first voltage-driven switching element, by using the intermediate voltage generated while the first voltage-driven switching element is off.

According to a third aspect of the present invention, there is provided a method of driving a semiconductor device comprising the steps of applying a voltage between a cathode and an anode of a voltage-driven switching element, generating a displacement current from a circuit which is connected between the cathode and anode of the voltage-driven switching element when the voltage applied to the voltage-driven switching element increases, emitting light from a light-emitting element on the basis of the displacement current generated, and applying a negative bias to a gate of the voltage-driven switching element by using a photovoltaic power of a photovoltaic element receiving the light emitted.

According to a fourth aspect of the present invention, there is provided a method of driving a semiconductor device having a plurality of insulated gates, comprising the steps of connecting a plurality of photovoltaic elements to the insulated gates respectively, the plurality of photovoltaic elements having different peak sensitivities of photovoltaic effect against lights differing in wavelength, and applying light having predetermined spectral distribution to the plurality of photovoltaic elements.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 is a circuit diagram showing a light-triggered semiconductor device according to a first embodiment of the present invention;

FIG. 6 is a circuit diagram showing a light-triggered semiconductor device according to a second embodiment of the present invention;

FIG. 9 is a circuit diagram illustrating a modification of the gate power-supply section incorporated in the device shown in FIG. 6;

FIG. 10 is a circuit diagram showing another modification of the gate power-supply section incorporated in the device of FIG. 6;

FIG. 11 is a circuit diagram illustrating still another modification of the gate power-supply section incorporated in the device of FIG. 6;

FIG. 16 is a perspective view showing the gate power-supply section of the device shown in FIG. 14, which is provided in the form of a one-chip unit;

FIG. 17 is a sectional view illustrating a peripheral portion of a light-triggered semiconductor device, i.e., an insulated-gate thyristor according to a fifth embodiment of the present invention;

FIG. 22 is a sectional view showing a second modification of the MOSFET shown in FIG. 20;

FIG. 23 is a sectional view showing a third modification of the MOSFET shown in FIG. 20;

FIG. 24 is a sectional view showing a fourth modification of the MOSFET shown in FIG. 20;

FIG. 25 is a sectional view showing a fifth modification of the MOSFET shown in FIG. 20;

FIG. 26 is a sectional view illustrating a sixth modification of the MOSFET shown in FIG. 20;

FIG. 27 is a sectional view showing a seventh modification of the MOSFET shown in FIG. 20;

FIG. 28 is a sectional view showing a eighth modification of the MOSFET illustrated in FIG. 20;

FIG. 29 is a sectional view showing a ninth modification of the MOSFET shown in FIG. 20;

FIG. 30 is a graph explaining a method of driving the MOSFET shown in FIG. 20;

FIG. 31 is a timing chart for explaining the method of driving the MOSFET illustrated in FIG. 20;

FIG. 32 is a sectional view of an insulated-gate semiconductor device, i.e., an insulated-gate thyristor, which is a eighth embodiment of the present invention;

FIG. 33 is a sectional view of a first modification of the insulated-gate thyristor shown in FIG. 32;

FIG. 34 is a timing chart explaining a method of driving the insulated-gate thyristor shown in FIG. 33;

FIG. 35 is a graph for explaining the principle of driving the insulated-gate thyristor illustrated in FIG. 33;

FIG. 36 is another graph for explaining the principle of driving the insulated-gate thyristor shown in FIG. 33;

FIG. 37 is a sectional view of a second modification of the insulated-gate thyristor shown in FIG. 32;

FIG. 38 is a sectional view of a third modification of the insulated-gate thyristor shown in FIG. 32;

FIG. 39 is a sectional view of a fourth modification of the insulated-gate thyristor shown in FIG. 32;

FIGS. 40A to 40C are diagrams representing the spectra of light beams which may be applied to trigger the insulated-gate thyristor illustrated in FIG. 39;

FIG. 41 is a plan view of the insulated-gate thyristor shown in FIG. 39; and

FIG. 42 is a sectional view of a fifth modification of the insulated-gate thyristor shown in FIG. 32.

DETAILED DESCRIPTION OF THE PREFERRED EMBODIMENTS

First Embodiment

Figure 1:
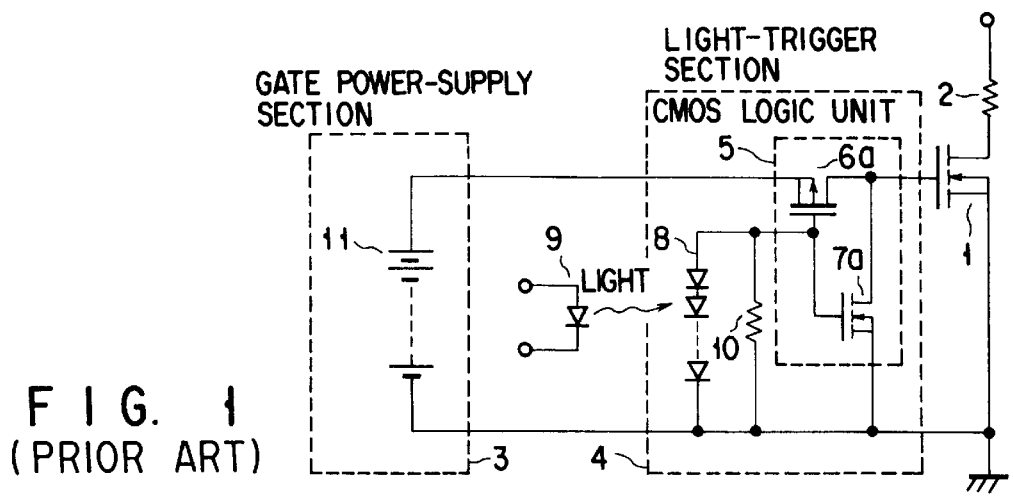
FIG. 1 is a schematic representation of a conventional light-triggered semiconductor device.

FIG. 5 shows a light-triggered semiconductor device according to the first embodiment of the present invention. The components similar or identical to those shown in FIG. 1 are designated with the same reference numerals and will not be described in detail, not only for the first embodiment but also for any other embodiment that will be described later.

The semiconductor device (FIG. 5) according to the first embodiment differs from the conventional device of FIG. 1 in the structure of the light-trigger section 4 and that of the gate power-supply section 3.

More specifically, the light-trigger section 4 of the first embodiment has two additional components, i.e., an N-channel enhancement MOSFET 17 having a small gate capacitance and an inverting resistor 18. The N-channel enhancement MOSFET 17, or an inverting switch, and the inverting resistor 18 cooperate to invert the photovoltaic power generated by the photodiode array 8. The photodiode array 8 functions as a photoelectric converting means.

The gate power-supply section 3 of the first embodiment comprises a high-voltage capacitor 19 being capable of charging quickly, a low-voltage capacitor 20, a high voltage-dividing resistor 21, a low voltage-dividing resistor 22, and a diode 23. The capacitors 19 and 20 are connected in series between the high-voltage main electrode (i.e., anode) and low-voltage main electrode (i.e., cathode) of the power MOSFET 1. The high voltage-dividing resistor 21 and the low voltage-dividing resistor 22 are connected in parallel to the capacitors 19 and 20, respectively. The diode 23 prevents the capacitors 19 and 20 from being discharged to the power MOSFET 1 when the power MOSFET 1 is turned on.

A Zener diode 24 is connected between the gate of the power MOSFET 1 and the ground (i.e., the low-voltage terminal). The Zener diode 24 prevents the power MOSFET 1 from being applied with a gate voltage higher than the gate withstand voltage. It is at its anode that the Zener diode 24 is connected to the ground. Nevertheless, the anode of the diode 24 may not be connected to the ground if the power MOSFET 1 is replaced by a plurality of power MOSFETs connected in series as may be done in practice.

In the semiconductor device according to the first embodiment, the power MOSFET 1 is turned on when the light-emitting photodiode 9 emits light, and is turned off when the photodiode 9 stops emitting light. In other words, the semiconductor device (FIG. 5) is light-triggered in normally-off mode.

The semiconductor device is a self-power supply device. Namely, an intermediate voltage is provided at the point between the main electrodes of the power MOSFET 1. The gate voltage need not be applied from an external source through an isolating transformer. Nor is it necessary to use photovoltaic power which is not suitable for achieving high-frequency driving of the device, unlike in the conventional light-triggered semiconductor device shown in FIG. 2.

In the first embodiment, the power MOSFET 1 can be light-triggered at high speed since the MOSFET 17 has a small gate capacitance. Moreover, the low-voltage capacitor 20 can be charged faster than in the case where the high-voltage capacitor 19 is replaced by a switching element which is turned on at a higher forward voltage drop and which has a higher withstand voltage.

Second Embodiment

FIG. 6 shows a light-triggered semiconductor device according to the second embodiment of the present invention. The second embodiment differs from the first embodiment (FIG. 5) in the structure of the light-trigger section 4. To be more specific, an N-channel enhancement MOSFET 6 which is a normally-off type element is used in place of the P-channel depletion MOSFET 6a (FIG. 1), and also a P-channel depletion MOSFET 7 which is a sort of normally-on type elements is used in place of the N-channel enhancement MOSFET 7a (FIG. 1).

Figure 7:
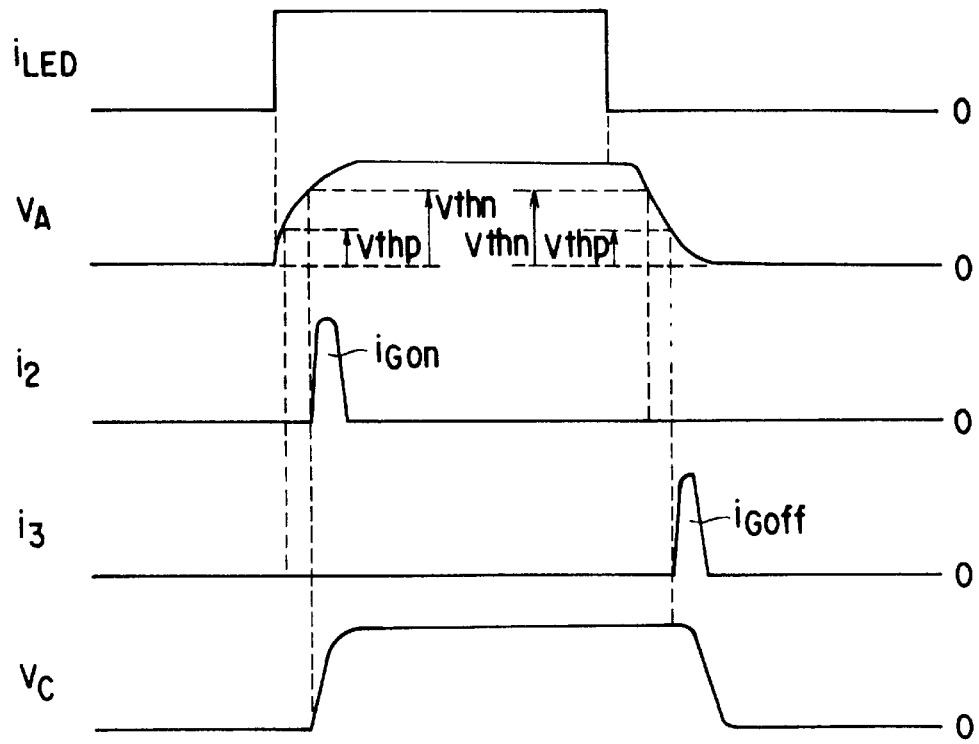
FIG. 7 is a timing chart explaining a method of driving the light-triggered semiconductor device shown in FIG. 6.

How the semiconductor device according to the second embodiment is light-triggered will be explained, with reference to the timing chart of FIG. 7.

First, a pulse voltage is applied to the light-emitting photodiode 9, whereby a current iLED flows through the photodiode 9. The photodiode 9 emits light, which is applied through an optical fiber or the like (not shown) to the photodiode array 8. A photovoltaic power is thereby generated at point A in FIG. 6, increasing the voltage VA at point A which is the common gate of the N-channel enhancement MOSFET 6 and the P-channel depletion MOSFET 7.

The MOSFETs 6 and 7 are designed such that their threshold voltages Vthn and Vthp have the relation of: Vthn>Vthp>0. Hence, the P-channel MOSFET 7 first becomes non-conducting, and the N-channel MOSFET 6 then becomes conducting. More precisely, a current i2 (=iGon) starts flowing through the N-channel MOSFET 6 after a current i3 ceases to flow in the P-channel MOSFET 7. As a result, the gate of the power MOSFET 1 is efficiently charged, and the voltage Vc at point C (i.e., the gate voltage of the power MOSFET 1) rises above the threshold voltage of the power MOSFET 1. The power MOSFET 1 is thereby turned on.

On the other hand, when the current iLED is reduced to nil, the photodiode 9 stops emitting light. The photodiode array 8 no longer generates photovoltaic power. Since Vthn>Vthp>0, the N-channel MOSFET 6 first becomes non-conducting, and the P-channel MOSFET 7 then becomes conducting. Therefore, the current i3 (=iGoff) starts flowing in the P-channel MOSFET 7 after the current i2 ceases to flow in the N-channel MOSFET 6. The charge accumulated in the gate of the power MOSFET 1 is therefore discharged efficiently. The gate voltage Vc of the power MOSFET 1 falls blow the threshold voltage, whereby the power MOSFET 1 is turned off.

As indicated above, Vthn>Vthp>0 in the second embodiment. This makes it possible to light-trigger the power MOSFET 1 with high efficiency with desired timing. The second embodiment may have a gate delay circuit to turn on one of the MOSFETs 6 and 7 upon elapse of a time longer than the turn-off time of the other of these MOSFETs. In this case, generation of a short current can be prevented reliably, and the semiconductor device can be light-triggered more efficiently.

Figure 8:
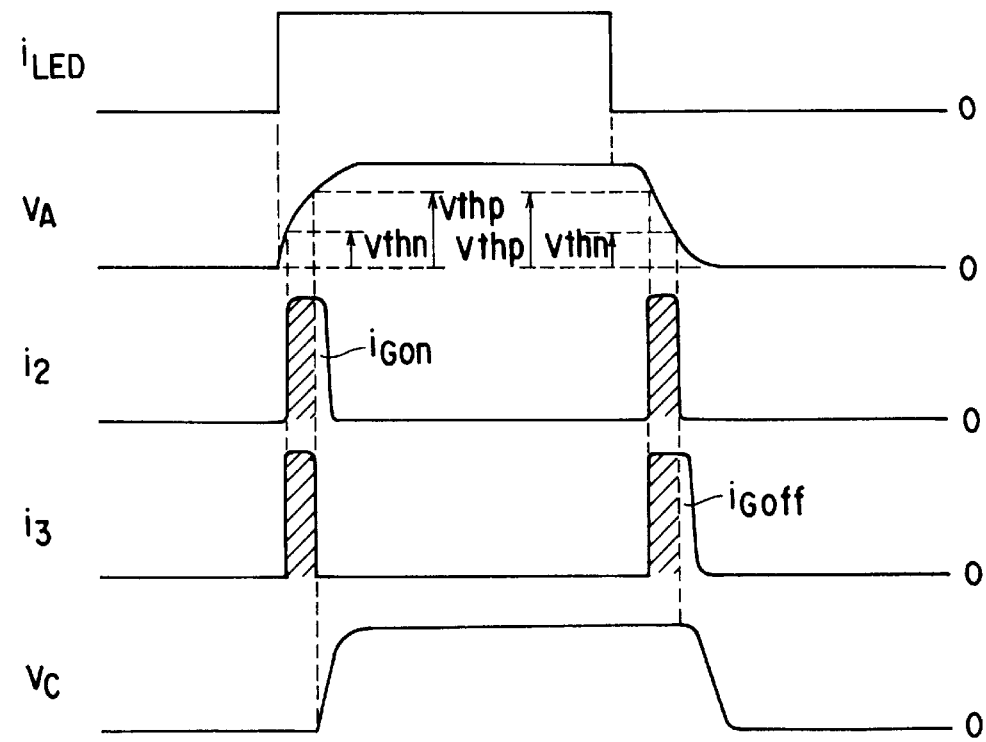
FIG. 8 is a timing chart explaining an undesired method of driving the light-triggered semiconductor device shown in FIG. 6.

FIG. 8 is a timing chart explaining an undesired method of driving the light-triggered semiconductor device. Assume that the threshold voltages of the MOSFETs 6 and 7 have the relation of Vthp>Vthn>0. Since this relation is not appropriate, the P-channel MOSFET 7 becomes non-conducting after the N-channel MOSFET 6 becomes conducting in the case where the light-emitting photodiode 9 emits light. In the case where the photodiode 9 ceases to emit light, the N-channel MOSFET 6 becomes non-conducting after the P-channel MOSFET 7 becomes conducting.

Thus, when the photodiode 9 starts emitting light or stops emitting light, short currents i2 and i3 flow through the N-channel MOSFET 6 and the P-channel MOSFET 7, respectively, as indicated by the shaded pulses shown in FIG. 8. While the short currents i2 and i3 are flowing when the photodiode 9 starts emitting light, the gate of the power MOSFET 1 remains not charged, and the power MOSFET 1 will be turned on with some delay. While the short currents i2 and i3 are flowing when the photodiode 9 stops emitting light, the gate of the power MOSFET 1 remains not discharged, and the power MOSFET 1 will be turned off with some delay.

FIG. 9 illustrates a modification 3a of the gate power-supply section 3 of the second embodiment (FIG. 6). In the modified gate power-supply section 3a, a Zener diode 25 is connected between the resistor 21 and the cathode K to clamp the voltage across the low-voltage capacitor 20. The voltage between the electrodes of the capacitor 20 is therefore prevented from rising above a predetermined value. A leakage current flows through the Zener diode 25, but this current is negligibly small since the resistor 21 connected in series to the diode 25 has a very high resistance.

FIG. 10 is a circuit diagram showing another modification 3b of the gate power-supply section 3 of the second embodiment. The modified section 3b further has a bipolar transistor 26 and a Zener diode 27. The collector of the bipolar transistor 26 is connected to a node of the resistors 21 and 22. The emitter of the transistor 26 is connected to the output terminal Gout of the section 3b. The Zener diode 27 is connected between the cathode K and the base of the transistor 26, clamping the base potential of the bipolar transistor 26. Even if the voltage between the capacitors 19 and 20 varies, the base voltage of the bipolar transistor 26 is clamped at the predetermined value by the Zener diode 27. A constant voltage is thereby output from the output terminal Gout.

FIG. 11 shows still another modification 3c of the gate power-supply section 3 of the second embodiment. The modified section 3c has a diode 23 which is connected between the capacitors 19 and 20 to prevent a current from flowing in reverse direction. The diode 23 must have but a withstand voltage as low as the gate withstand voltage (tens of volts), whereas its counterparts shown in FIGS. 9 and 10 needs to have a withstand voltage as high as that of an output switching element. Hence, the diode 23 is smaller than those shown in FIGS. 9 and 10. The gate power-supply section 3c can be more compact than the gate power-supply sections 3a ad 3b shown in FIGS. 9 and 10, respectively.

The second embodiment not only has the same advantages as the first embodiment, but also is advantageous in the following respects.

First, the power MOSFET 1 is quickly discharged even if the voltage between the main electrodes of the MOSFET 1 rises and a Miller current flows to charge the parasitic capacitance between the drain and gate of the MOSFET 1, while the light-emitting photodiode 9 is emitting no light. Hence, the power MOSFET 1 would not be fired even when its gate voltage increases.

Second, the voltage output from the terminal Gout is prevented from rising above the predetermined value since the gate power-supply section 3 has the Zener diode 25 which clamps the voltage across the low-voltage capacitor 20. Further, in the modified section 3b shown in FIG. 10 which has the bipolar transistor 26 and the Zener diode 27 clamping the base voltage, the voltage output from the terminal Gout is prevented from varying. Still further, the modified section 3c shown in FIG. 11 is more compact than the sections 3a ad 3b (FIGS. 9 and 10), because the diode 23 connected between the capacitors 19 and 20, preventing a current from flowing in reverse direction, is smaller than its counterparts incorporated in the gate power-supply sections 3a ad 3b shown in FIGS. 9 and 10.

Third Embodiment

Figure 12:
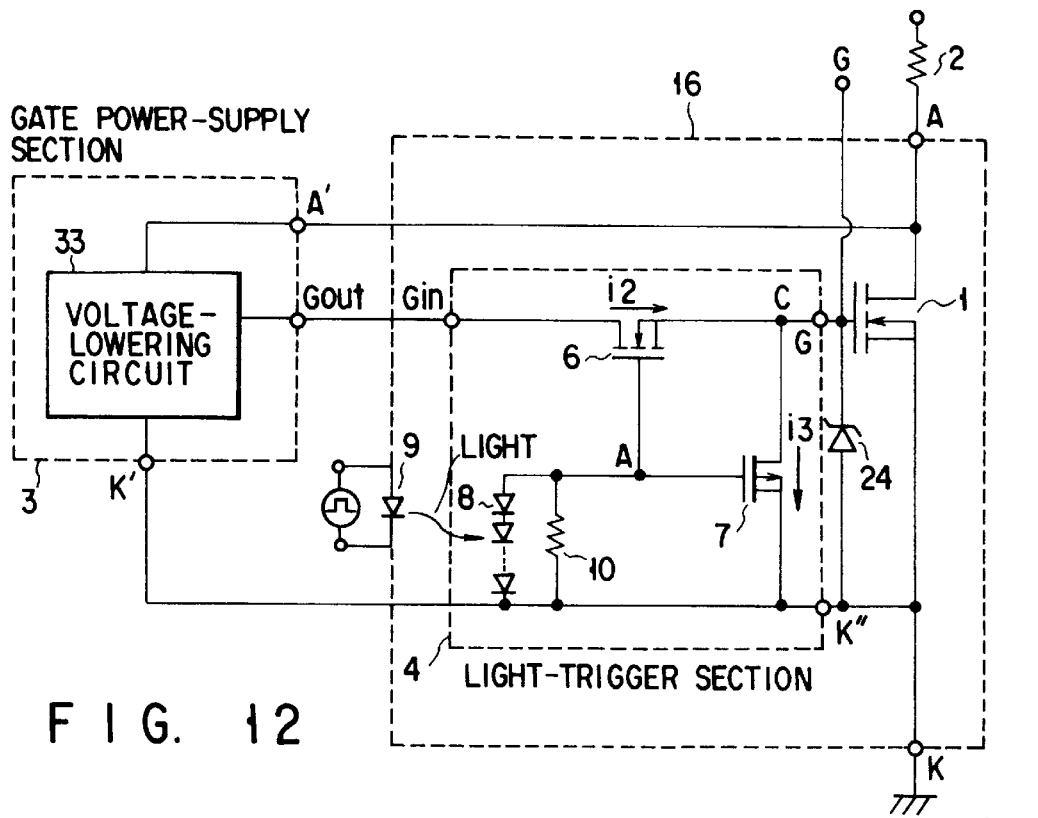
FIG. 12 is a circuit diagram showing a light-triggered semiconductor device according to a third embodiment of the present invention.

FIG. 12 shows a light-triggered semiconductor device according to the third embodiment of the present invention.

The third embodiment differs from the second embodiment (FIG. 6) in that the gate power-supply section 3 is a voltage-lowering circuit 33 for stabilizing the voltage output from the terminal Gout.

More precisely, the voltage-lowering circuit 33 first lowers the voltage between the main electrodes of the power MOSFET 1 (e.g., 450 V) to about 200 V, then applies the low voltage to a capacitor (not shown), thereby stabilizing the voltage, and finally lowers the stabilized voltage to about 15 V.

In the third embodiment (FIG. 12), the power MOSFET 1 and the light-trigger section 4 are incorporated in a package 16, and the voltage-lowering circuit 33 is provided in the form of another package located near the package 16. Instead, the voltage-lowering circuit 33 may be provided in the form of an integrated circuit incorporated in the package 16.

Figure 13:
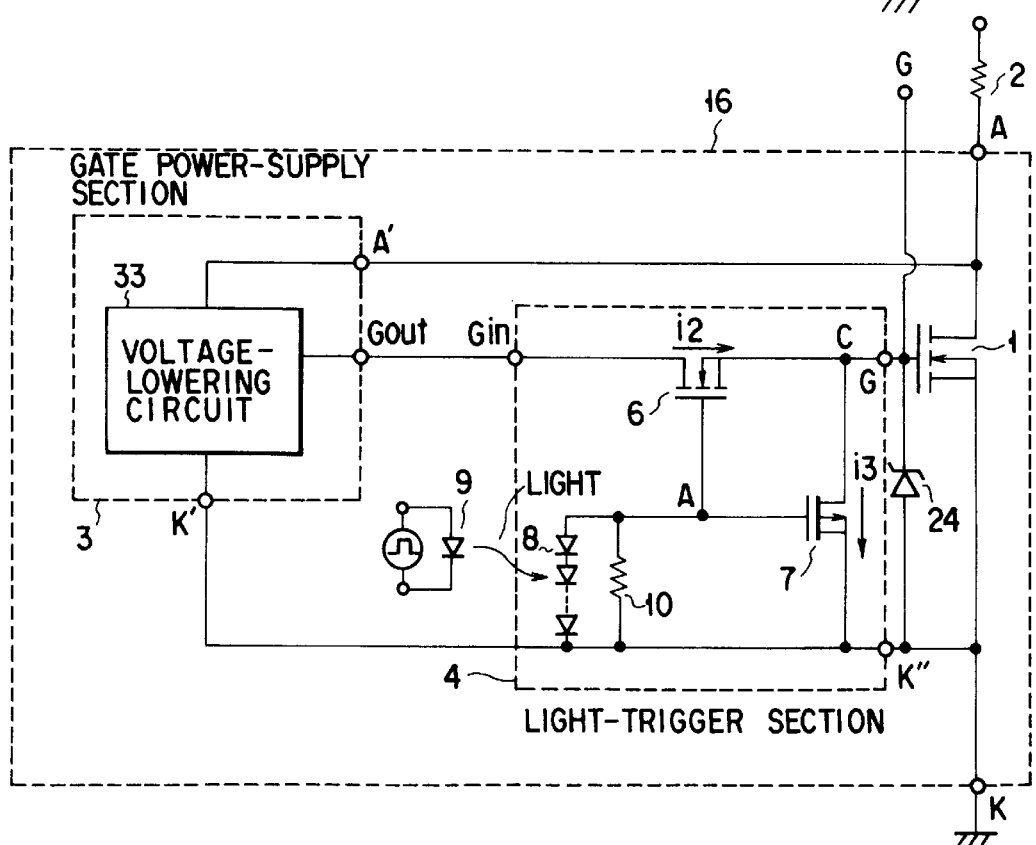
FIG. 13 is a circuit diagram illustrating a modification of the device shown in FIG. 12.

FIG. 13 illustrates a modification of the third embodiment, in which the circuit 33 is provided in the package 16.

In the third embodiment it is possible to stabilize the voltage output from the terminal Gout as in the second embodiment. Additionally, the gate power-supply section 3 can be incorporated into the package, along with the power MOSFET 1 and the light-trigger section 4, if it is provided in the form of an integrated circuit.

Fourth Embodiment

Figure 14:
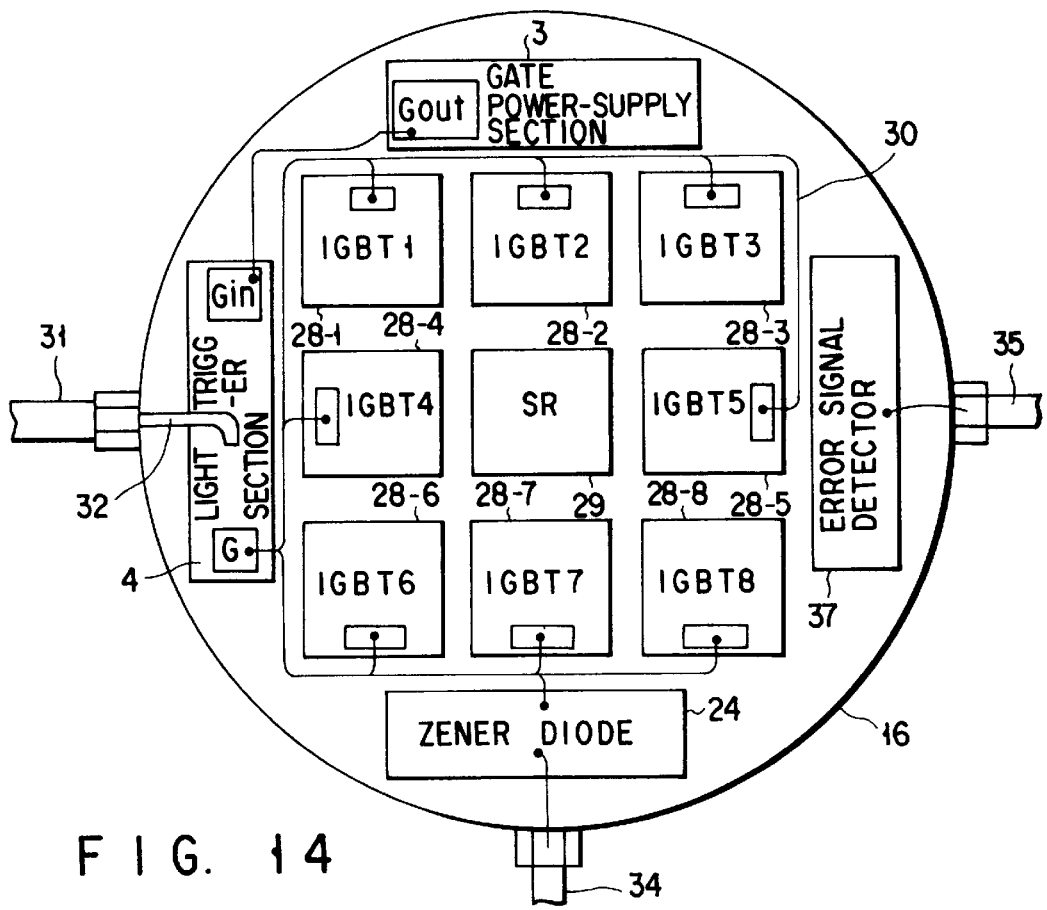
FIG. 14 is a schematic representation of a light-triggered semiconductor device according to a fourth embodiment of the present invention.

FIG. 14 shows a light-triggered semiconductor device which is the fourth embodiment of the present invention.

The fourth embodiment is provided in the form of an package 16 and is identical to the first embodiment (FIG. 5), except that IGBTs are used in place of the power MOSFET 1.

As shown in FIG. 14, the fourth embodiment comprises a gate power-supply section 3, a light-trigger section 4, a Zener diode unit 24, eight IGBT chips 28-1 to 28-8, a diode unit 29, and an error signal generator 37. The IGBT chips 28-1 to 28-8 are arranged around the diode unit 29, with their gate pads facing outwards. Leads can therefore be easily connected to the gate pads of the IGBT chips. The light-trigger section 4 is a one-chip unit. The gate power-supply section 3 is also a one-chip unit.

A trigger optical signal is supplied from an external source to the package 16 through an optical fiber 31. In the package 16, the signal is supplied through a light guide 32 to the photodiode array (not shown) provided in the light-trigger section 4. The section 4 is connected to the gate power-supply section 3, the Zener diode unit 24 and the IGBT chips 28-1 to 28-8 by wires which extend along the outer sides of the IGBT chips 28-1 to 28-8. The error signal generator 37 detects any excessive gate voltage applied to the any IGBT chip and any excessive current flowing in any IGBT chip and generates an error signal upon detecting an excessive gate voltage and an excessive current. The error signal is supplied from the package 16 via a error signal output terminal 35. A gate terminal 34 is connected to the Zener diode unit 24, which is connected to all IGBT chips 28-1 to 28-8. Thus, the gate voltage of each IGBT chip -can be detected from outside through the gate terminal 34.

The package 16 may be of the ordinary type which is connected to other devices by wire-bonding. Alternatively, it may be a press-contact package. If the package 16 is a press-contact one, a current can be supplied from the IGBT chips 28-1 to 28-8 and the main electrodes of the diode unit 29 effectively, and heat can radiate from both of the main electrodes of the IGBT chips 28-1 to 28-8 and the main electrodes of the diode unit 29. Therefore, a large current can flow through the package 16, and heat can be dissipated efficiently from the package when the device is driven at a high frequency.

Figure 15:
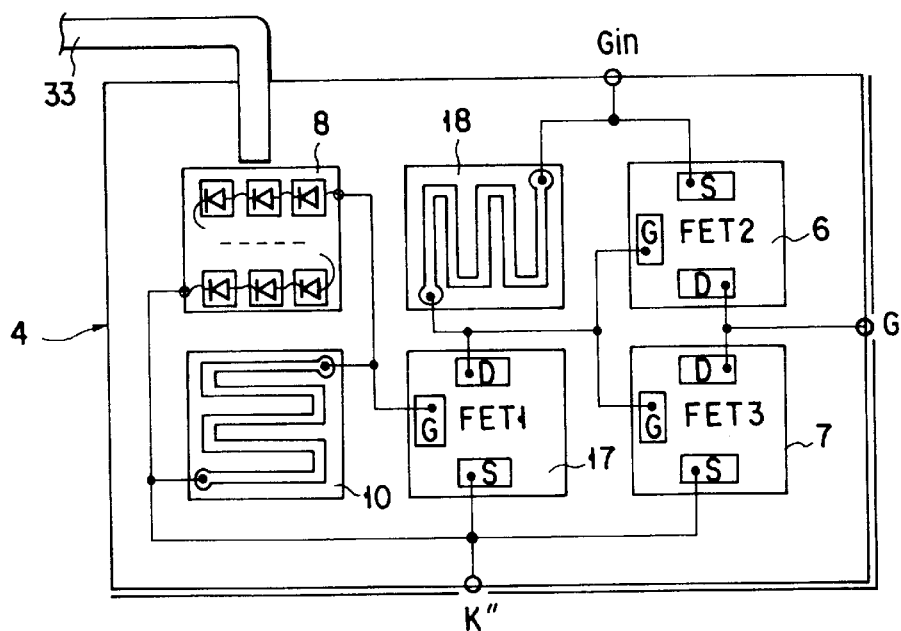
FIG. 15 is a diagram showing the light-trigger section of the device shown in FIG. 14, which is provided in the form of a one-chip unit.

FIG. 15 shows the one-chip light-trigger section 4 in detail, and FIG. 16 the one-chip gate power-supply section 3 (having no component equivalent to the diode 23). As shown in FIG. 16, the low-voltage capacitor 20 is composed of a first electrode $20_1$, an insulating film $20_2$ and a second electrode $20_3$. The high-voltage capacitor 19 is formed of a first electrode $19_1$, an insulating film $19_2$ and a second electrode (not shown). The second electrode of the capacitor 19 is provided on the back of the insulating film $19_2$. The electrodes $20_3$ and $19_1$ are one and the same.

In the fourth embodiment, the IGBT chips 28-1 to 28-8 are driven by the optical signals supplied from the external source through the optical fiber 31. The fourth embodiment therefore operates, free from the influence of electromagnetic noise.

Like the first, second and third embodiments, the fourth embodiment is a self-power supply semiconductor device in which the gate voltage is an intermediate voltage provided at the midpoint between the main electrodes of a power MOSFET. Therefore, the gate voltage need not be applied to the package 16 from an external source. When the packages identical to the package 16 are connected in series, it is still unnecessary for each package to have an isolating transformer which isolates an external gate-voltage source from the IGBT chips 28-1 to 28-8. The semiconductor device according to the fourth embodiment can therefore be made small as a whole.

Figure 2:
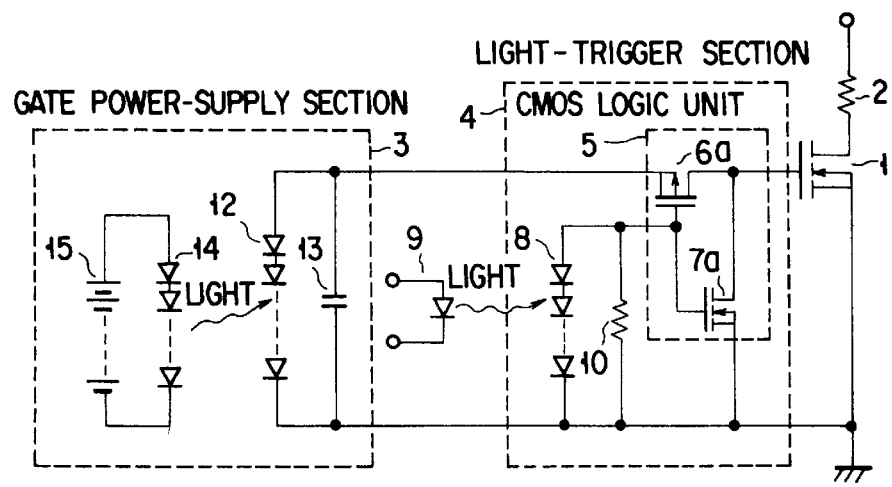
FIG. 2 is a schematic representation of another conventional light-triggered semiconductor device.

The charging current is sufficiently large unlike in the conventional devices shown in FIGS. 1 and 2 in which a photovoltaic power is used to apply a bias to the gates of the MOSFETs. Therefore, the light-triggered device according to the fourth embodiment can be driven at a high frequency.

Furthermore, when packages identical to the package 16 are connected in series or in parallel, they can be driven in synchronization. This is because the gate terminal 34, which is connected by the Zener diode unit 24 to the IGBT chips 28-1 to 28-8, detects the gate potentials of the IGBT chips 28-1 to 28-8.

A control signal is supplied from a drive circuit to each package through an optical fiber. The time the control signal requires to reach the gate pads of the IGBT chips of one package differs from the time it requires to reach the gate pads of the IGBT chips of another package. This is inevitably because each control signal is delayed more or less in the intervening electric wire and the electric circuit than any other control signal is delayed. To make the control signals reach the gate pads of the IGBT chips of all packages at the same time, the delays of the control signals are measured, and the control signals are supplied from the drive circuit at different times. This scheme of supplying the control signals is called "gage checking."

The gate checking is performed while no voltage is applied between the main electrodes of each IGBT chip incorporated in any package. It is therefore possible to determine the gate voltage near the gate pad of the IGBT chip, by connecting a wire directly to the gate terminal 34, without using an isolating transformer. Thus, the condition in which a gate voltage is applied to the IGBT chips 28-1 to 28-8 can be checked externally of the package 16. This condition cannot be detected by checking only the terminal of the optical fiber 31.

Fifth Embodiment

FIG. 17 is a sectional view illustrating a peripheral portion of a light-triggered semiconductor device according to the fifth embodiment of the present invention. To state more precisely, the fifth embodiment is a light-triggered thyristor.

As seen from FIG. 17, various layers are provided between the cathode electrode 205 and anode electrode 206. Among these layers are a high-resistance, n-type base layer 201 and a p-type emitter layer 204. A p-type base layer 202, a $p^+$-type layer 221, a $p^-$-type RESURF layer 222 and an $n^+$-type stopper layer 223 are provided in the surface of the n-type base layer 201. Provided on the n-type base layer 201 and located one upon another are: insulating films 224, 225, 228, an electrode 226, a high-resistance field plate 227, an electrode 19$_1$, an insulating film 19$_2$, an electrode 19$_3$, an electrode 20$_0$, an insulating film 20$_2$ and an electrode 20$_3$. The electrode 19$_1$, insulating film 19$_2$ and electrode 19$_3$ constitute a high-voltage capacitor 19. The electrode 20$_1$, insulating film 20$_2$ and electrode 20$_3$ constitute a low-voltage capacitor 20. The electrodes 19$_1$, and 20$_3$ are one and the same electrode.

The high-resistance field plate 227 defines a junction-termination region surrounding the element section, imparting a high withstand voltage to the light-triggered thyristor. The insulating film 228 is provided on the field plate 227, and the high-voltage capacitor 19 and the low-voltage capacitor 20 are provided on the insulating film 228. The light-triggered thyristor (i.e., the fifth embodiment) has a gate power-supply section (not shown), which is a compact one identical to the modified section 3c (FIG. 11) incorporated in the second embodiment.

The junction-termination region extends as long as hundreds of microns. This region is utilized, making it possible to form the capacitors 19 and 20 (which provides an intermediate voltage) in the form of a monolithic component.

An infinitesimal current flows through the high-resistance field plate 227, shielding an electric field. Hence, the electrode potential of the capacitors 19 and 20 would not influence the potentials in the semiconductor layers located below the high-resistance field plate 227. Switching elements for charging the capacitors, switching elements for discharging the capacitors, and elements for generating photovoltaic power may be formed in another region of the chip. If this is the case, an element having all functions can be provided in the form of a single chip.

Sixth Embodiment

Figure 18:
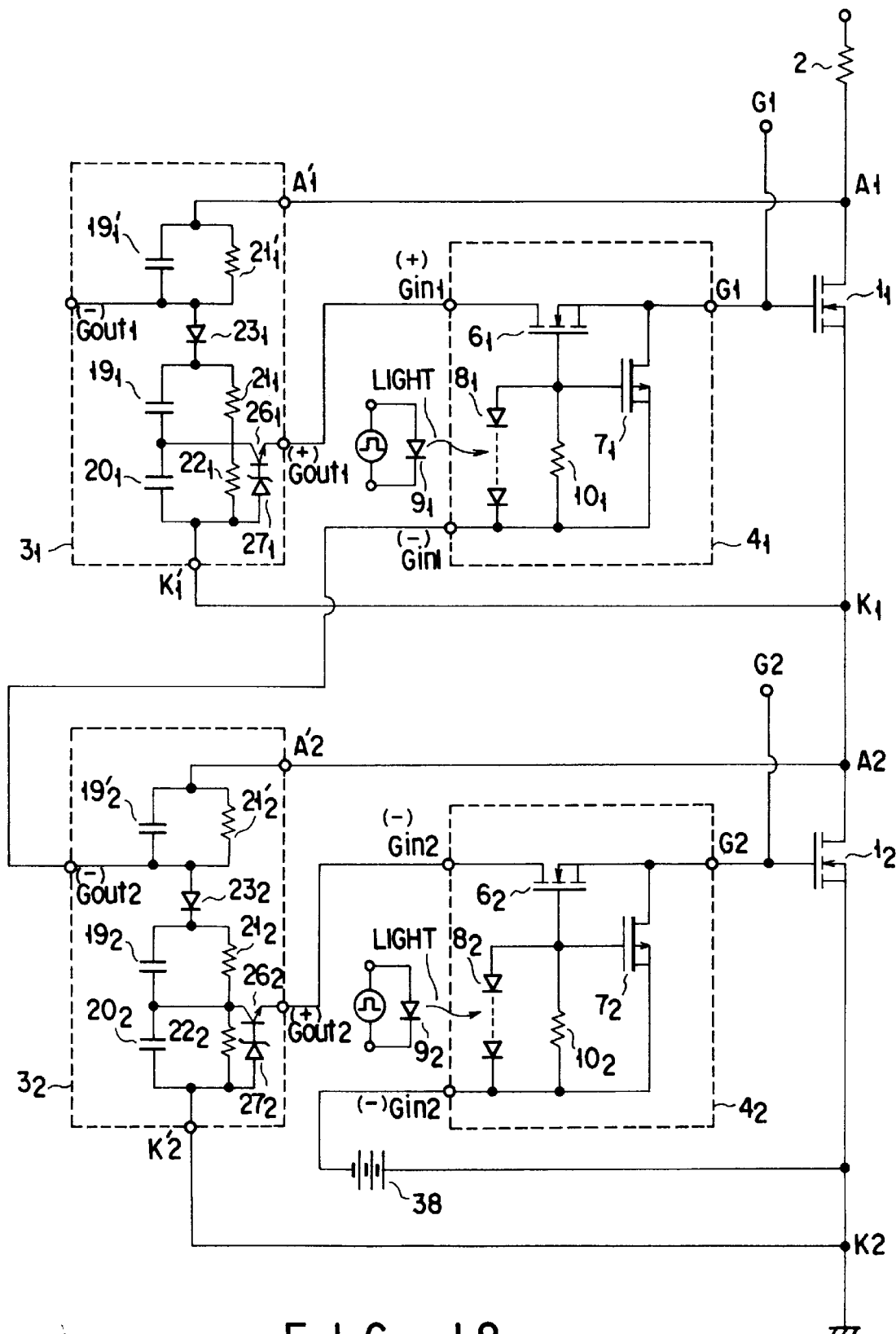
FIG. 18 is a circuit diagram showing a light-triggered semiconductor device according to a sixth embodiment of the present invention.

FIG. 18 shows a light-triggered semiconductor device according to the sixth embodiment of the present invention.

As illustrated in FIG. 18, the sixth embodiment has two power MOSFETs 1$_1$ and 1$_2$, two gate power-supply sections 3$_1$ and 3$_2$, and two light-trigger sections 4$_1$ and 4$_2$. The power MOSFETs 1$_1$ and 1$_2$ are connected in series, for switching a high voltage. Both light-trigger sections 4$_1$ and 4$_2$ are of the same structure as the light-trigger section 4 of the second embodiment (FIG. 6). The terminal Gin1(−) of the light-trigger section 4$_1$ is connected to the terminal Gout2(−) of the gate power-supply section 3$_2$, whereas the low-voltage terminal K" is connected to the cathode terminal K in the second embodiment (FIG. 6).

The gate power-supply section 3$_1$ comprises a high-voltage capacitor 19$_1$', a high-voltage side resistor 21$_1$', a diode 23$_1$, an intermediate capacitor 19$_1$, an intermediate resistor 21$_1$, a low-voltage side capacitor 20$_1$, and a low-voltage side resistor 22$_1$. These components are arranged in the order mentioned and connected to one another. The resistors 21$_1$', 21$_1$ and 22$_1$, each provided for dividing a voltage, have such resistances that the voltage between the resistors 21$_1$' and 22$_1$, is about 15 V while the power MOSFET 1$_1$ remains off.

The gate power-supply section 3$_2$ has exactly the same structure as the gate power-supply section 3$_1$, and will not be described in detail. The terminal Gout2(−) of the gate power-supply section 3$_2$ for supplying power to the power MOSFET 1$_2$ is connected to the terminal Gin1(−) of the light-trigger section 4$_1$ for triggering the power MOSFET 1$_1$.

In the sixth embodiment described above, a negative bias is applied to the gate terminal G1 of the power MOSFET 1$_1$ while the power MOSFET 1$_1$ remains off. The power MOSFET 1$_1$ is not erroneously fired even if the voltage at the anode A1 changes. No negative bias can be applied from the low-voltage side of the power MOSFET 1$_2$, because the power MOSFET 1$_2$ is located at the low-voltage side. This is why a negative bias power supply 38 is connected between the cathode electrode K2 and the terminal Gin2(−). The cathode terminal K2, i.e., the component located closer to the low-voltage side than any other component, is connected to the ground. This makes it unnecessary to interpose an isolating transformer between the cathode terminal K2 and the power MOSFET $1_2$. The semiconductor device according to the sixth embodiment can be smaller than otherwise.

The diode $23_2$, which is provided to prevent a reverse current flow, is connected to the low-voltage end of the high-voltage capacitor $19_2$' so that no high voltage is generated at the terminal Gout2(−) when the power MOSFET $1_2$ is turned on. Instead, the diode $23_2$ may be connected to the low-voltage end of the intermediate capacitor $19_2$, as the capacitor 23 (FIG. 11) incorporated in the second embodiment.

The gate power-supply sections and $3_1$ and $3_2$ are similar in structure to their equivalent (FIG. 10) used in the second embodiment. They stabilize the voltages at the terminals Gout1(+) and Gout2(+), respectively. Should Zener diodes 24 be used to clamp the gate voltages of the power MOSFETs $1_1$ and $1_2$ as in the second embodiment (FIG. 6), it would be impossible to apply a sufficiently high negative bias to the gate terminals G1 and G2.

The sixth embodiment has two power MOSFETs $1_1$ and $1_2$ connected in series. Instead, three or more power MOSFETs may be connected in series. In addition, the sixth embodiment may be electrically driven, not light-triggered, because negative biases can be generated in the same way as described above, when the device is electrically driven.

In the sixth embodiment, a negative bias is applied to the gate terminal G1 of the power MOSFET $1_1$ while the power MOSFET $1_1$ remains off. Thus, the power MOSFET $1_1$ is not erroneously fired even if the voltage at the anode A1 changes. Therefore, the sixth embodiment can be a light-triggered semiconductor device which operates with high reliability.

Seventh Embodiment

Figure 19:
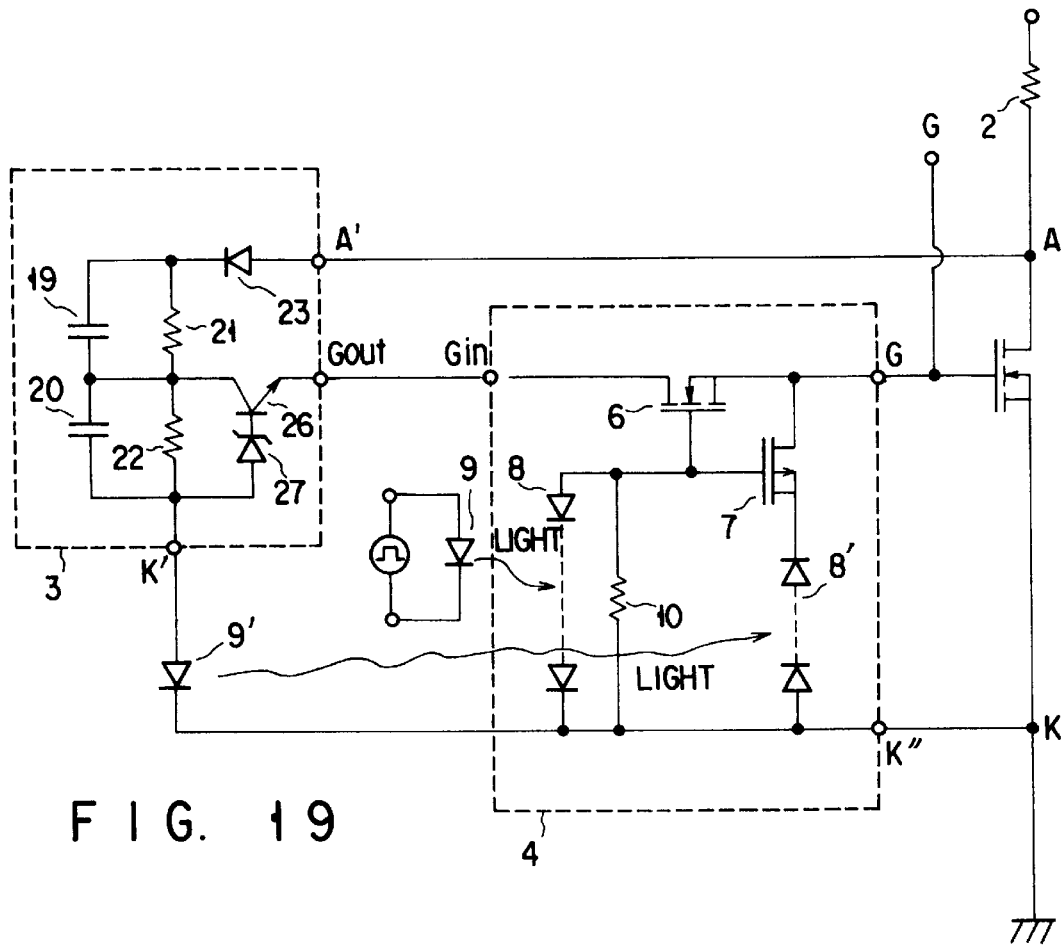
FIG. 19 is a circuit diagram showing a light-triggered semiconductor device according to a seventh embodiment of the present invention.

FIG. 19 illustrates a light-triggered semiconductor device according to the seventh embodiment of the present invention.

The seventh embodiment differs form the second embodiment (FIG. 6) in two respects. First, a light-emitting diode 9' is connected between the low-voltage terminal K' and cathode electrode K of the gate power-supply section 3. Second, a photodiode array 8' is connected between the cathode electrode K and the P-channel depletion MOSFET 7 incorporated in the light-trigger section 4. The gate power-supply section 4 has the same structure as its counterpart (FIG. 10) of the second embodiment. Were a Zener diode to be used to clamp the gate voltage of the power MOSFET as in the gate power-supply section shown in FIG. 6, the Zener diode would be biased forwards due to the electromotive force generated in the photodiode array 8'. A loop current would then flow, making it impossible to apply a sufficient negative bias to the gate terminal G.

When a voltage is applied between the anode terminal A and cathode terminal K of the power MOSFET 1 at a voltage-increasing rate of dv/dt, a displacement current, C×(dv/dt), flows to the light-emitting diode 9' through the capacitors 19 and 20, where C is the composite capacitance of the capacitors 19 and 20. As a result, the light-emitting diode 9' emits light. The light is applied thorough an optical fiber or the like to the photodiode array 8'. The photodiode array 8' converts the light into an electromotive force. The electromotive force renders the P-channel depletion MOSFET 7 conducting. A negative bias is thereby applied to the gate terminal G of the power MOSFET 1.

The power MOSFET 1 will not be fired as in the conventional light-triggered device, even if its gate voltage increases at the high rate dv/dt, and will remain off. The seventh embodiment can, therefore, be a light-triggered semiconductor device which operates with high reliability.

Eighth Embodiment

Figure 20:
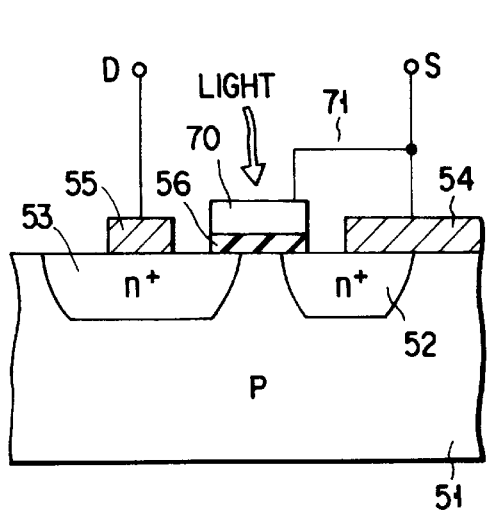
FIG. 20 is a sectional view of an insulated-gate semiconductor device, i.e., a MOSFET according to an eighth embodiment of the present invention.

FIG. 20 is a sectional view of an insulated-gate semiconductor device, i.e., a MOSFET, which is an eighth embodiment of the present invention.

This MOSFET has two insulated gates. For simplicity of explanation, however, FIG. 20 shows only the section having one of these insulated gates. (For the modifications of the MOSFET, which are shown in FIGS. 21 to 29, too, only the section having one of the insulated gates will be described.)

As can be understood from FIG. 20, an n-type source layer 52 and an n-type drain layer 53 are provided in the surface of a p-type base layer 51. The source layer 52 and the drain layer 53 are spaced apart from each other. A source electrode 54 is mounted on the base layer 51, contacting not only the base layer 51 but also the source layer 52. A drain electrode 55 is mounted on the drain electrode 53. A gate-insulating film 56 is provided on that portion of the base layer 51 which is located between the source layer 52 and the drain layer 53. Provided on the gate-insulating film 56 is an element 70 capable of generating a photovoltaic power. The element electrode 70 is electrically connected by a wire 71 to the source electrode 54, setting the source electrode 54 at a reference potential.

To turn the MOSFET on, light having such a wavelength to which the element 70 is most sensitive is applied to the element 70. The element 70 converts the light into an electromotive force. The electromotive force sets the n-channel below the element 70 into a conducting state. An electron current therefore flows from the n-type source layer 52 to the n-type drain layer 53 through the n-type channel. The MOSFET is thereby turned on.

On the other hand, to turn the MOSFET off, the application of the light is stopped. The potential of the element 70 falls to zero-bias level, or the source potential. The n-type channel is thereby set into a non-conducting state. Thus, the MOSFET is turned off.

Figure 21:
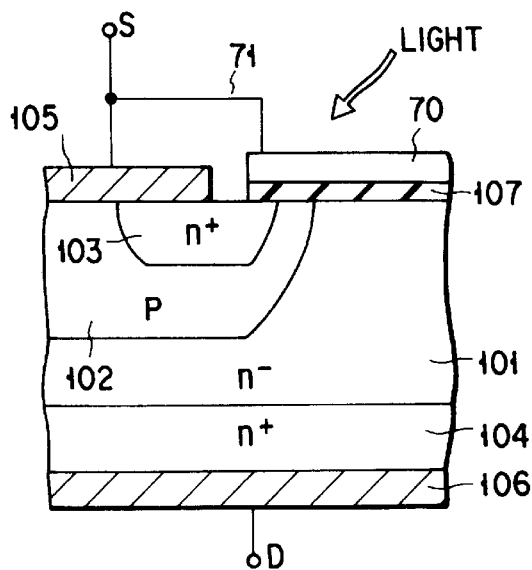
FIG. 21 is a sectional view showing a first modification of the MOSFET illustrated in FIG. 20.

FIG. 21 shows the first modification of the MOSFET illustrated in FIG. 20. As shown in FIG. 21, a p-type base layer 102 is provided in one surface of an n-type base layer 101, and an n-type source layer 103 is provided in the surface of the p-type base layer 102. A n-type drain layer 104 is provided on the opposite surface of the n-type base layer 101. A source electrode 105 is mounted on the n-type source layer 103, and a drain electrode 106 on the n-type drain layer 104. A gate-insulating film 107 is provided on the p-type base layer 102 on the n-type base layer 101, covering parts of the base layer 102 and source layer 103. An insulated gate electrode, or a photovoltaic power generating element 70, is mounted on the gate-insulating film 107. The element 70 is connected electrically by a wire 71 to the source electrode 105, setting the source electrode 105 at a reference potential.

FIG. 22 shows the second modification of the MOSFET shown in FIG. 20. As illustrated in FIG. 22, a gate-insulating film 56 is formed on that portion of a p-type base layer 51 which is located between the n-type source layer 52 and n-type drain layer 53, which are provided in the surface of the base layer 51 and which are spaced form each other. An insulated gate electrode 57 is provided on the gate-insulating film 56. A semiconductor element 70 capable of generating a photovoltaic power is provided in the surface of the same substrate 58 in which the p-type base layer 51 is provided. The element 70 is electrically connected to the insulated gate electrode 57. Accordingly, the element 70 can be laminatedly formed on a desired surface of the substrate 58 or on a junction-termination region.

FIG. 23 shows the third modification of the MOSFET shown in FIG. 20. This modified MOSFET differs from the MOSFET of FIG. 20 only in that the photovoltaic power generating element 70 is composed of a p-type semiconductor layer 73 and a n-type semiconductor layer 74, which constitute a pn junction. The n-type semiconductor layer 74 is electrically connected by a wire 71 to the source electrode 54 and is zero-biased. When light is applied to the pn junction, the element 70 generates a photovoltaic power. The p-type semiconductor layer 73 is positively biased to the n-type source layer 52. The semiconductor layers 73 and 74 can be made of CdS, CdTe or the like. In principle, the layers 73 and 74 cooperate to generate photovoltaic power which is equivalent to their band gap. The layers 73 and 74 may be made of different semiconductor materials, to form a hetero junction. In this case, the element 70 can generate a photovoltaic power from light having a wavelength over a broad band.

When the application of light to the element 70 is stopped, the photovoltaic power ceases to exist within a short time of the order of nanosecond, due to the recombination of carriers in the semiconductor layers 73 and 74. The n-type semiconductor layer 74 is therefore zero-biased very fast. In order to eliminate the photovoltaic power much faster, weak light different in wavelength from the excitation light (i.e., the light to be converted into the photovoltaic power) may be applied as quenching light to the element 70, to eliminate carriers (a voltage) in the same manner as in light quenching or induced emission.

FIG. 24 shows the fourth modification of the MOSFET illustrated in FIG. 20. The fourth modified MOSFET differs from the MOSFET of FIG. 20 only in that the photovoltaic power generating element 70 is a cascade structure. More precisely, it is composed two or more pn junctions connected in series and one electrode 75 interposed between adjacent two of the pn junctions. The modified MOSFET can therefore output a high voltage (i.e., a high gate voltage).

FIG. 25 shows the fifth modification of the MOSFET shown in FIG. 20. The fifth modified MOSFET is identical to the first modified MOSFET illustrated in FIG. 21, except that the photovoltaic power generating element 70 is composed of a p-type semiconductor layer 73 and the a n-type semiconductor layer 74. The semiconductor layers 73 and 74 constitute a pn junction.

FIG. 26 illustrates the sixth modification of the MOSFET shown in FIG. 20. The sixth modified MOSFET is identical to the first modified MOSFET illustrated in FIG. 21, except that the photovoltaic power generating element 70 has a cascade structure. In other words, the element 70 comprises two or more pn junctions connected in series.

FIG. 27 shows the seventh modification of the MOSFET shown in FIG. 20. The seventh modified MOSFET is identical to the second modified MOSFET (FIG. 22 ), except for two respects. First, an insulating film 59 is provided on the same substrate 58 in which the p-type base layer 51 is provided. Second, the photovoltaic power generating element 70 is composed of a p-type semiconductor layer 73 and a n-type semiconductor layer 74, both provided on the insulating film 59.

FIG. 28 is a sectional view showing the eighth modification of the MOSFET illustrated in FIG. 20. This is a p-channel MOSFET having a photovoltaic power generating element 70. The element 70 is composed of a p-type semiconductor layer 73 and the an n-type semiconductor layer 74, which constitute a pn junction. The p-type semiconductor layer 73 is electrically connected by a wire 71 to the source electrode 54 and is therefore zero-biased. When light is applied to the pn junction, the element 70 generates photovoltaic power. As a result, the n-type semiconductor layer 74 is negatively biased to the source electrode 54, whereby the p-channel becomes conducting.

FIG. 29 shows the ninth modification of the MOSFET shown in FIG. 20. The ninth modified MOSFET differs from the MOSFET of FIG. 20 in that a photovoltaic power generating element 70 is used in place of the gate electrode. The element 70 has a Schottky barrier. More specifically, the element 70 is composed of a p-type semiconductor layer 73 and a barrier metal layer 76. The layer 73 is provided on the gate-insulating film 56, and the barrier metal layer 76 on the layer 73. The barrier metal layer 76 is comprised of, for example, an ZnS layer and an Au, Pd or Pt layer formed on the ZnS layer. When light is applied to the barrier metal layer 76, the element 70 generates a photovoltaic power.

FIGS. 30 and 31 are a graph and a timing chart, for explaining a method of driving the MOSFET shown in FIG. 20.

To trigger the MOSFET which has two photovoltaic power generating elements $70_1$ and $70_2$, light having the spectrum distribution illustrated in FIG. 30 is applied to the entire MOSFET or a part thereof. As shown in FIG. 30, the light has two energy peaks at two wavelengths $\lambda 1$ and $\lambda 2$. The element 70 is most sensitive to a light beam having the wavelength $\lambda 1$, whereas the element $70_2$ is most sensitive to a light beam having the wavelength $\lambda 2$. As can be understood from the timing chart of FIG. 31, a light beam of the wavelength $\lambda 1$ is first applied to the MOSFET, and a light beam of the wavelength $\lambda 2$ is then applied to the MOSFET. Upon receipt of either light beam, the element $70_1$ and the gate generate different photovoltaic powers.

Figures 3, 4:
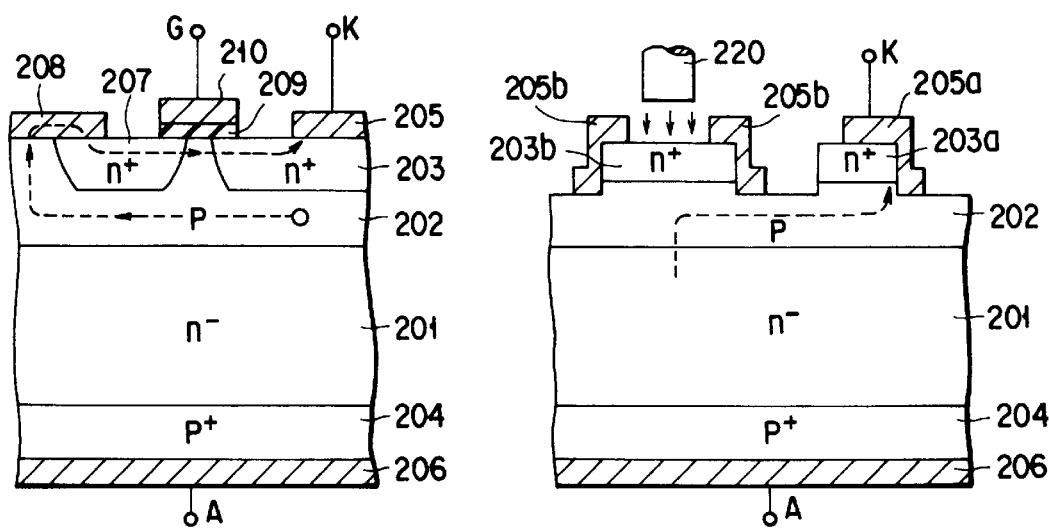
FIG. 3 is a sectional view showing the turn-off insulated gate section of a conventional insulated-gate semiconductor device, i.e., an insulated-gate thyristor.
FIG. 4 is a sectional view showing the light-receiving section of a conventional light-triggered thyristor (LTT)

FIG. 32 is a sectional view of an insulated-gate semiconductor device, i.e., an insulated-gate thyristor included in a eighth embodiment. The components similar or identical to those shown in FIGS. 3 and 4 are designated at the same reference numerals in FIG. 32 and will not be described in detail.

The element shown in FIG. 32 is a insulated-gate thyristor. As shown in FIG. 32, the insulated gate of the thyristor is composed of a p-type semiconductor layer 73 and a n-type semiconductor layer 74, which constitute a pn junction.

FIG. 33 is a sectional view of a first modification of the insulated-gate thyristor shown in FIG. 32. As seen from FIG. 33, the first modified thyristor has a plurality of insulated gates. It comprises a n-type base layer 201, a p-type base layer 202 provided in the surface of the n-type base layer 201, a n-type emitter layer 203 provided in the surface of the p-type base layer 202, and a cathode electrode 205 mounted on the n-type emitter layer 203. A drain electrode 208 is mounted on the p-type base layer 202 and located adjacent to the n-type emitter layer 203. An n-type drain layer 207 is provided in the surface of the p-type base layer 202 and short-circuited to the layer 202 by the drain electrode 208.

An n-type source layer 213 is provided in the surface of the p-type base layer 202, spaced apart from the n-type drain layer 207 by a predetermined distance. A gate-insulating film 209 is provided on that portion of the base layer 202 which is located between the n-type drain layer 207 and the n-type source layer 213. Mounted on the gate-insulating film 209 is a turn-off gate electrode which is composed of a p-type semiconductor layer 73a and a n-type semiconductor layer 74a. The turn-off gate electrode can generate a photovoltaic power. The electrodes 214, 208 and the turn-off gate electrode, the n-type drain layer 207, and the n-type source layer 213 constitute a turn-off MOSFET.

A gate-insulating film 211 is provided on that portion of the p-type base layer 202 which is located between the n-type base layer 201 and the n-type emitter layer 203. A turn-on gate electrode is mounted on the gate-insulating film 211 . The turn-on gate electrode is composed of a p-type semiconductor layer 73b and a n-type semiconductor layer 74b. The turn-on gate electrode, the n-type base layer 201 and the n-type emitter layer 203 constitute a turn-on MOSFET.

A p-type emitter layer 204 is provided on the lower surface of the n-type base layer 201. An anode electrode 206 is provided on the p-type emitter layer 204. How the insulated-gate thyristor shown in FIG. 33 is driven will be explained with reference to the timing chart of FIG. 34.

To turn on the thyristor, light having a wavelength $\lambda 1$ to which the semiconductor layers 73b and 74b are most sensitive is applied to the thyristor. Therefore, the p-type semiconductor layer 73a of the turn-off gate electrode is zero-biased, and a positive voltage is applied to the p-type semiconductor layer 73b of the turn-on gate electrode. Electrons are injected from the n-type emitter layer 203 into the n-type base layer 201 through the n-channel located below the p-type semiconductor layer 73b, and holes as many as the electrons, are injected from the p-type emitter layer 204 into the n-type base layer 201. The thyristor is thereby turned on.

To turn off the thyristor, light is applied to the thyristor, which light has a spectrum having peaks at a wavelength $\lambda 1$ to which the semiconductor layers 73b and 74b are most sensitive and at a wavelength $\lambda 2$ to which the semiconductor layers 73a and 74b are most sensitive. Therefore, a positive voltage is applied to the p-type semiconductor layer 73a of the turn-off gate electrode and also to the p-type semiconductor layer 73b of the turn-on gate electrode.

In FIG. 33, the solid line indicates the path along which an electron current flows when a positive voltage is applied to the p-type semiconductor layer 73b of the turn-on gate electrode, setting the turn-on MOSFET into conducting state, and the broken line indicates the path along which a hole current flows when a positive voltage is applied to the p-type semiconductor layer 73a of the turn-off gate electrode, setting the turn-off MOSFET into conducting state. Attracted toward the drain electrode 208, the hole current flows from the p-type base layer 202 and passes through the n-type drain layer 207, the n-channel below the p-type semiconductor layer 73a and the n-type source layer 213. Finally, it flows out of the insulated-gate thyristor. The path along which the hole current flows is the same as in an IGBT. In other words, the hole current flows in the same way as in a transistor. Hence, the injection of electrons stops when a light beam having only the wavelength $\lambda 2$ is applied, setting the turn-off MOSFET into non-conducting state, upon lapse of a predetermined time ($\Delta t$) after a positive voltage has been applied to the p-type semiconductor layer 73a of the turn-off gate electrode.

FIG. 34 is a timing chart explaining a method of drawing the insulated-gate thyristor shown in FIG. 33.

FIGS. 35 and 36 are graphs for explaining the principle of driving the insulated-gate thyristor shown in FIG. 33. To drive the thyristor, light having the spectrum shown in FIG. 36 is applied to the thyristor with the timing represented in FIG. 34.

FIG. 37 is a sectional view of the second modification of the insulated-gate thyristor shown in FIG. 32.

To turn on this modified insulated-gate thyristor, the n-channel MOSFET comprising an n-type base layer 201, a p-type base layer 202 and a n-type emitter layer 203 is turned on, thereby injecting electrons. To turn off the thyristor, the p-channel MOSFET comprising the p-type base layer 202, the n-type emitter layer 203 and a p-type source layer 215 is turned on, thereby expelling holes. The thyristor has an insulated gate of npn structure, having two pn junctions. The first pn junction is composed of a p-type semiconductor layer 73 and a n-type semiconductor layer 74a. The second pn junction is composed of the p-type semiconductor layer 73 and a n-type semiconductor layer 74b. Therefore, the p-type semiconductor layer 73 is positively biased when the thyristor is applied with light having a wavelength $\lambda$ which is equal to the distance between the surface of the gate and the first pn junction. At the same time, the n-type semiconductor layer 74b is positively biased. The n-type semiconductor layer 74b is negatively biased when the thyristor is applied with light having a wavelength $\lambda+\alpha$ which is equal to the distance between the surface of the gate and the second pn junction. Thus, both a positive bias and a negative bias can be applied to the same gate by applying two beams of different wavelengths, which reach different depths in the thyristor.

FIG. 38 shows the third modification of the insulated-gate thyristor shown in FIG. 32. As seen from FIG. 38, the insulated gate of this modified thyristor has two pn junctions with their p-type layers contacting each other. In other words, the thyristor has a np/pn gate structure. The first pn junction is composed of a p-type semiconductor layer 73a and an n-type semiconductor layer 74a, which are made of the same material. The second pn junction is composed of a p-type semiconductor layer 73b and a n-type semiconductor layer 74b, which are made of material which differs in band gap from the material of the p-type semiconductor layer 73a and a n-type semiconductor layer 74a. Hence, a positive bias and a negative bias, which are of different values, can be applied to the same gate by applying two beams which have different wavelengths and which reach different depths in the thyristor.

FIG. 39 shows the fourth modification of the insulated-gate thyristor shown in FIG. 32. As can be seen from FIG. 39, this modified thyristor has two insulated gates. The first insulated gate is composed of a n-type layer and a p-type layer mounted on the n-type layer, which constitute a pn junction. The second insulated gate is composed of a p-type layer and a n-type layer mounted on the p-type layer, which constitute a pn junction. The pn junction of the first gate is located at a distance from the upper surface of the first gate, and the pn junction of the second gate is located at a shorter distance from the upper surface of the second gate. Thus, by applying light beams which have different wavelengths which can reach different depths, to the insulated gates, both insulated gates can be controlled. The wavelengths of the light beams may be slightly varied. In this case, the resistances of both the electron-injecting MOSFET and the hole-expelling MOSFET can be changed continuously, whereby the thyristor is driven in a high-performance mode.

FIGS. 40A to 40C represent the wavelength spectra of light beams which may be applied to trigger the modified insulated-gate thyristor illustrated in FIG. 39. More specifically, FIG. 40A illustrates the spectrum of light which has peaks at wavelengths $\lambda 1$ and $\lambda 1+\alpha$, respectively, FIG. 40B indicates the spectrum of light having wavelength $\lambda 1$, and FIG. 40C shows the spectrum of light having wavelength $\lambda 1+\alpha$.

FIG. 41 is a plan view of the insulated-gate thyristor shown in FIG. 39. As seen from FIG. 41, two or more gates can be arranged on the entire element region, unlike in the conventional thyristor in which an electric signal is supplied to the insulated gate to drive the thyristor and in which all gate wires of the same system must be electrically connected in the entire element region. Therefore, the elements can be arranged in a matrix pattern in the thyristor of FIG. 39.

FIG. 42 illustrates the fifth modification of the insulated-gate thyristor shown in FIG. 32. As shown in FIG. 42, the junction-termination region surrounding the element region has a high-resistance field plate 227, which imparts a high withstand voltage to the thyristor. An insulating film 228 is formed on the field plate 227, and a photovoltaic power generating element 70 is provided on the insulating film 228. The element 70 is comprised of a p-type semiconductor layer 73 and an n-type semiconductor layer 74. A gate voltage source which can generates a sufficiently high voltage can be provided, without reducing the effective area of the element region.

In the semiconductor devices according to the first to seventh embodiment, described above in detail, the first and second switching means are not closed at the same time, and a predetermined voltage is applied to the control electrode. The devices can therefore be light-triggered at high speed. Since an intermediate voltage provided at the midpoint between the low-and high-voltage main electrodes of the power MOSFET is used as control voltage, the semiconductor devices need not have isolating transformers. The devices can therefore be smaller than otherwise. Due to the high-voltage capacitance which is fast charged in the gate power supply section, the low-voltage capacitor can be charged faster than in the case where a switching element having a high withstand voltage and a high on-voltage is used in place of the high-voltage capacitor.

As described above, the semiconductor device according to the eighth embodiment has a plurality of insulated gates and a plurality of photovoltaic power generating elements are connected to the insulated gates, respectively. Since these elements are most sensitive to light beams of different wavelengths, a photovoltaic power can be generated in each element, easily and reliably at a desired value. Hence, the semiconductor device can be driven in a high-performance mode. As mentioned above, light having a spectrum having peaks at the wavelengths to which the photovoltaic power generating elements are most sensitive is applied to the semiconductor device. The device can therefore be driven more easily than otherwise.

In addition, even under electrical driving in place of optical driving, it is possible to generate a power used as the negative bias by a similar constitution as the above constitution.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the power MOSFET, the IGBT, or the insulated-gate thyristor used in the first to seventh embodiments unit may be replaced by another type of voltage-driven switching element. In this case, the device attains the same advantage. Further, the MOSFET or the insulated-gate thyristor may be replaced by any other type of an insulated-gate switching element in the eighth embodiment to achieve the same advantage. Moreover, in the first to seventh embodiments, the power MOSFET whose low-voltage main electrode is connected in the ground may be replaced by a three-phase inverter whose outermost portion is connected to the ground.

What is claimed is:

1. A method of driving a semiconductor device with a device drive circuit comprising a voltage-driven switching element, a voltage-lowering circuit connected between a cathode and an anode of said voltage-driven switching element to have any voltage applied between the cathode and the anode of the voltage-driven switching element also applied to the voltage-lowering circuit, an enhancement-type MOSFET charging switching element for charging a gate of said voltage-driven switching element, a depletion-type MOSFET discharging switching element for discharging the gate of said voltage-driven switching element, and a photovoltaic element for driving said charging switching element and said discharging switching element, said method comprising the steps of:

applying a voltage between the cathode and the anode of said voltage-driven switching element;

generating a stabilized intermediate voltage from said voltage-lowering circuit receiving said applied voltage between the cathode and the anode of the voltage-driven switching element; and driving said charging and discharging switching elements to provide said voltage-driven switching element with said stabilized intermediate voltage using a photovoltaic power generated by said photovoltaic element.

2. The method according to claim 1, wherein said driving step includes the step of alternately turning on said charging switching element and said discharging switching element such that said charging switching element only becomes conducting after said discharging switching element becomes non-conducting.

3. The method according to claim 1, further comprising the step of providing a circuit which prevents the intermediate voltage from rising above a predetermined value.

4. The method according to claim 1, including providing said voltage-lowering circuit so as to include capacitors, resistors, and a reverse current-flow preventing diode.

5. The method according to claim 1, including providing the charging switching element with a higher threshold voltage than that of the threshold voltage of the discharging switching element.

6. A method of driving a semiconductor device comprising the steps of:

applying a voltage difference between a cathode and an anode of a plurality of voltage-driven switching elements connected in series;

generating an intermediate voltage from a first voltage-driven switching element of said plurality of voltage-driven switching elements; and applying a negative bias to a gate of a second voltage-driven switching element of said plurality of voltage-driven switching elements, which is located on a higher voltage side than that of said first voltage-driven switching element, by using the intermediate voltage generated while said first voltage-driven switching element is off.

7. A method of driving a semiconductor device comprising the steps of:

applying a voltage difference between a cathode and an anode of a voltage-driven switching element;

generating a displacement current from a circuit which is connected between the cathode and anode of said voltage-driven switching element when the voltage applied to said voltage-driven switching element increases;

emitting light from a light-emitting element on the basis of the displacement current generated; and applying a negative bias to a gate of said voltage-driven switching element by using a photovoltaic power of a photovoltaic element receiving the light emitted.

8. A semiconductor device comprising:

a voltage-driven switching element having a cathode and an anode connected to a voltage;

a voltage-lowering circuit connected between the cathode and anode of said voltage-driven switching element to receive said voltage and generating a stabilized intermediate voltage;

an enhancement-type MOSFET charging switching element charging a gate of said voltage-driven switching element using the stabilized intermediate voltage generated by said power-lowering circuit;

a depletion-type MOSFET discharge switching element discharging the gate of said voltage-driven switching element; and a photovoltaic element generating a photovoltaic power to drive said charging switching element and said discharging switching element.

9. A semiconductor device comprising:

a plurality of voltage-driven switching elements connected in series, each having a cathode and an anode, in which a voltage difference is to be applied between the cathode and anode;

intermediate voltage generating circuit for generating an intermediate voltage from a first voltage-driven switching element of said plurality of voltage-driven switching elements; and a circuit for applying a negative bias to a gate of a second voltage-driven switching element of said plurality of voltage-driven switching elements, which is located on a higher voltage side than that of said first voltage-driven switching element, using the intermediate voltage generated by said intermediate voltage generating circuit while said second voltage-driven switching element is off.

10. A semiconductor device comprising:

a voltage-driven switching element having a cathode and an anode, in which a voltage difference is to be applied between the cathode and anode;

a displacement current generating circuit connected between the cathode and anode of said voltage-driven switching element, for generating a displacement current when the voltage applied to said voltage-driven switching element increases;

a light-emitting element for emitting light when the displacement current is generated by said displacement current generating circuit; and a photovoltaic element for generating a photovoltaic power by receiving the light emitted by said light-emitting element, and thereby applying a negative bias to a gate of said voltage-driven switching element.

11. A semiconductor device formed as one package, comprising:

a plurality of voltage-driven switching elements, each of the voltage-driven switching elements having a cathode and an anode with a voltage connected between the cathode and the anode;

a gate power-supply circuit formed as one chip and connected between the cathode and anode of each of said plurality of voltage-driven switching elements and receiving said voltage, said gate power-supply circuit generating a stabilized intermediate voltage used as a gate charging voltage for each of said plurality of voltage-driven switching elements; and a light trigger circuit formed as one chip, said light trigger circuit including,
   an enhancement-type MOSFET charging switching element for charging a gate of each of said plurality of voltage-driven switching elements using the stabilized intermediate voltage generated by said gate power-supply circuit,
   a depletion-type MOSFET discharging switching element for discharging the gate of each of said plurality of voltage-driven switching elements, and
   a photovoltaic element generating photovoltaic power to drive said charging switching element and said discharging switching element.

12. The semiconductor device according to claim 11, further comprising a light guide unit supplying a trigger optical signal transferred from outside a package containing the semiconductor device to said photovoltaic element inside the package.

13. The device according to claim 11, further comprising:

a Zener diode unit connected to the gate of each of said plurality of voltage-driven switching elements; and a gate terminal connected to said Zener diode, said gate terminal transferring the gate voltage of said plurality of voltage-driven switching elements outside of a package containing the chips making up the semiconductor device.

14. The device according to claim 11, further comprising:

an error signal generator generating an error signal upon detecting any excessive gate voltage applied to any voltage-driven switching element and any excessive current flowing in any voltage-driven switching element; and an error signal output terminal connected to said error signal generator, said error signal output terminal transferring the error signal outside of a package containing the semiconductor device.

15. The semiconductor device according to claim 11, wherein said plurality of voltage driven switching elements are insulated gate bipolar transistors.

* * * * *